(12) United States Patent
Mokhlesi et al.

(10) Patent No.: US 8,097,504 B2
(45) Date of Patent: Jan. 17, 2012

(54) METHOD FOR FORMING DUAL BIT LINE METAL LAYERS FOR NON-VOLATILE MEMORY

(75) Inventors: Nima Mokhlesi, Los Gatos, CA (US); Jun Wan, San Jose, CA (US)

(73) Assignee: SanDisk Technologies Inc., Milpitas, CA (US)

( * ) Notice: Subject to any disclaimer, the term of this patent is extended or adjusted under 35 U.S.C. 154(b) by 312 days.

(21) Appl. No.: 11/768,461

(22) Filed: Jun. 26, 2007

(65) Prior Publication Data
US 2009/0004843 A1 Jan. 1, 2009

(51) Int. Cl.
*H01L 21/336* (2006.01)

(52) U.S. Cl. ........ 438/257; 438/201; 438/211; 438/622; 257/E21.575; 257/E21.645

(58) Field of Classification Search ................ 438/257, 438/622; 257/E21.575, E21.645; 365/63
See application file for complete search history.

(56) References Cited

U.S. PATENT DOCUMENTS

| | | | |
|---|---|---|---|
| 4,324,975 A | 4/1982 | Rees | |
| 5,545,906 A | 8/1996 | Ogura et al. | |
| 5,933,380 A | 8/1999 | Tsuchida et al. | |
| 6,058,044 A | 5/2000 | Sugiura | |
| 6,080,624 A | 6/2000 | Kamiya | |
| 6,282,113 B1 | 8/2001 | DeBrosse | |
| 6,291,335 B1 * | 9/2001 | Schnabel et al. | 438/626 |
| 6,469,392 B2 | 10/2002 | Park et al. | |
| 6,504,204 B1 | 1/2003 | Hsu et al. | |
| 2002/0158273 A1 * | 10/2002 | Satoh et al. | 257/211 |
| 2002/0163063 A1 * | 11/2002 | Noguchi et al. | 257/666 |
| 2002/0172067 A1 | 11/2002 | Kirihata | |
| 2003/0072172 A1 * | 4/2003 | Somasekhar et al. | 365/63 |
| 2003/0094632 A1 | 5/2003 | Kobayashi | |
| 2003/0123272 A1 * | 7/2003 | Kang et al. | 365/63 |
| 2003/0206450 A1 | 11/2003 | Cernea | |
| 2004/0108512 A1 | 6/2004 | Iwata et al. | |
| 2006/0113581 A1 | 6/2006 | Miki | |
| 2006/0280022 A1 | 12/2006 | Kono | |
| 2007/0004143 A1 * | 1/2007 | Saito et al. | 438/257 |
| 2007/0046885 A1 * | 3/2007 | Kim et al. | 349/155 |
| 2009/0231913 A1 * | 9/2009 | Tonomura et al. | 365/163 |

OTHER PUBLICATIONS

U.S. Appl. No. 11/768,468, filed Jun. 26, 2007.
Office Action dated Jun. 3, 2010, U.S. Appl. No. 11/768,468, filed Jun. 26, 2007.
Response to Office Action dated Sep. 3, 2010, U.S. Appl. No. 11/768,468, filed Jun. 26, 2007.
Office Action dated Dec. 6, 2010, U.S. Appl. No. 11/768,468, filed Jun. 26, 2007.
Amendment dated Mar. 2, 2011, U.S. Appl. No. 11/768,468, filed Jun. 26, 2007.

* cited by examiner

*Primary Examiner* — Charles Garber
*Assistant Examiner* — Abdulfattah Mustapha
(74) *Attorney, Agent, or Firm* — Vierra Magen Marcus & DeNiro LLP

(57) ABSTRACT

Structures and techniques are disclosed for reducing bit line to bit line capacitance in a non-volatile storage system. The bit lines are formed at a 4f pitch in each of two separate metal layers, and arranged to alternate between each of the layers. In an alternative embodiment, shields are formed between each of the bit lines on each metal layer.

12 Claims, 18 Drawing Sheets

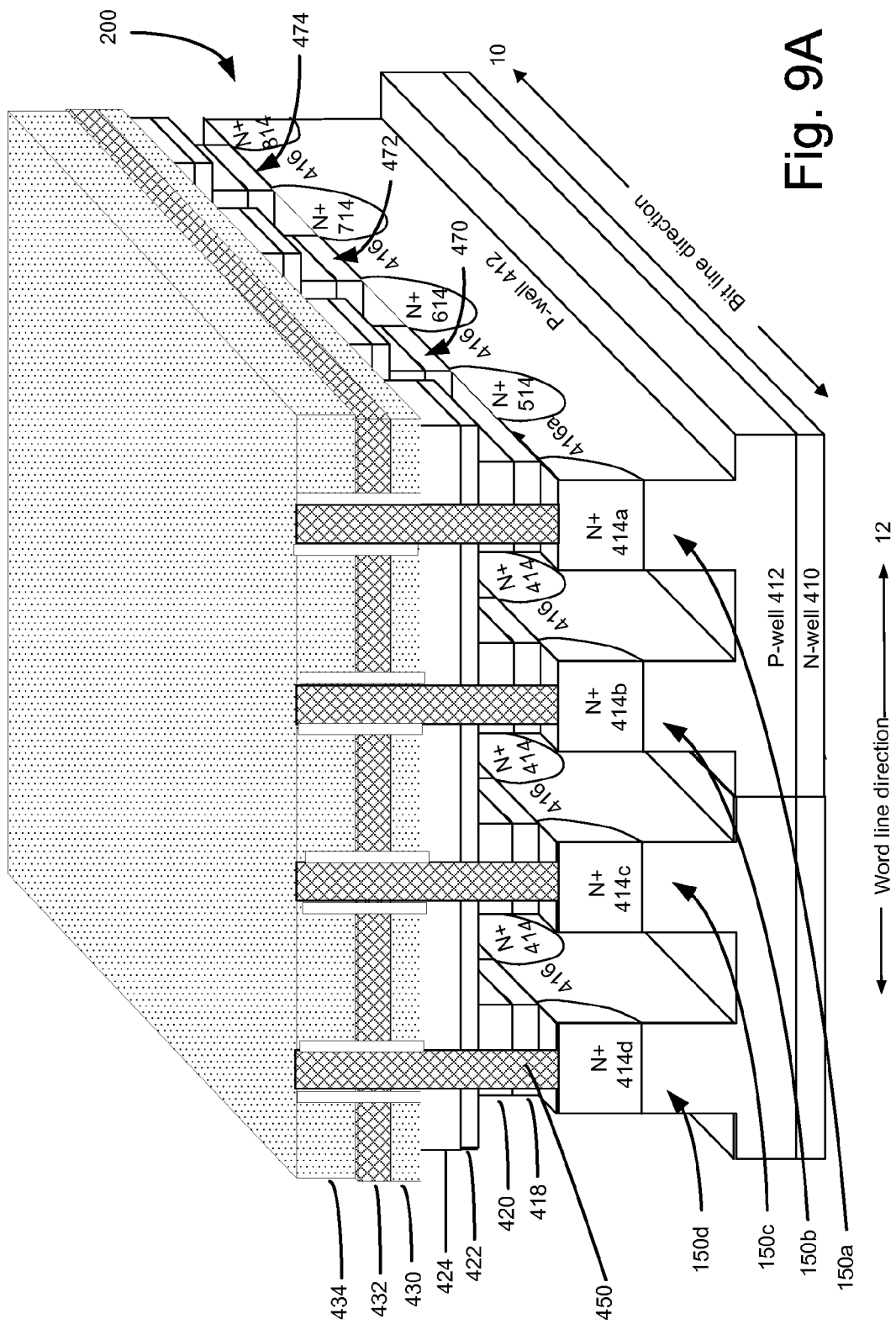

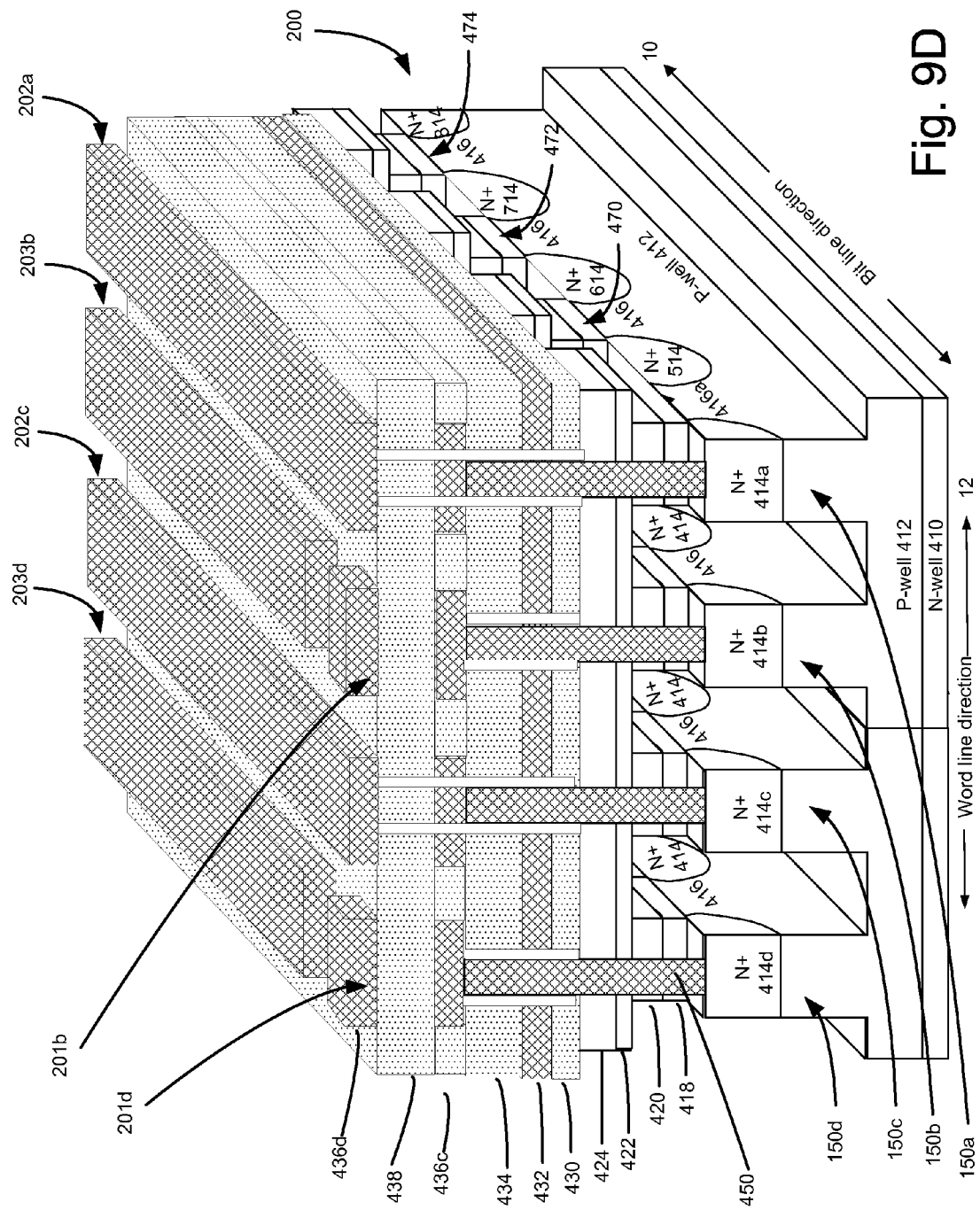

METHOD FOR FORMING DUAL BIT LINE METAL LAYERS FOR NON-VOLATILE MEMORY

CROSS-REFERENCE TO RELATED APPLICATIONS

The following application is cross-referenced and incorporated by reference in its entirety: U.S. patent application Ser. No. 11/768,468, entitled "Dual Bit Line Metal Layers for Non-Volatile Memory" by Nima Mokhlesi and Jun Wan, filed the same day as the present application.

BACKGROUND

The present disclosure relates to non-volatile memory structures, and more particularly, to techniques for forming bit lines in such structures.

Semiconductor memory has become more popular for use in various electronic devices. For example, non-volatile semiconductor memory is used in cellular telephones, digital cameras, personal digital assistants, mobile computing devices, non-mobile computing devices and other electronic devices. Electrical Erasable Programmable Read Only Memory (EEPROM) and flash memory are among the most popular non-volatile semiconductor memories.

Both EEPROM and flash memory utilize a transistor structure having a floating gate that is positioned above and insulated from the channel region in a semiconductor substrate, as well as between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

In one embodiment, the control gates associated with rows of memory elements are also utilized as word line connections. Bit line connections are made by forming bit lines in a metal layer above the word lines in correspondence with columns of memory elements, and forming vias through metal layer to contact the drain regions of the memory elements. The state of a non-volatile memory element can be determined by applying a pre-charge voltage to the bit line, applying a reference voltage to the control gate, then discharging the bit line and sensing the voltage on the bit line. If the memory element is on, the bit line voltage will drop. If the bit line is off, the bit line voltage will not drop, but will be about the same as during the pre-charge state.

One problem with sensing memory elements simultaneously is capacitive coupling of adjacent bit lines. The sensed bit line may be coupled down by the adjacent bit line(s) if the adjacent bit lines voltage drops. The sensed memory elements may therefore look like they are on, leading to read errors. The continuing increase in scaling of transistors leads to increases in total bit line capacitance and parasitic bit line to bit line capacitance thereby further exacerbating this problem.

One solution to the problem of capacitive coupling, or bit line to bit line crosstalk, is to avoid sensing all bit lines at once, and instead, only sense odd or even bit lines, and then to turn the bit lines off for elements already sensed. However, the time delay associated with sensing odd and even bit lines impacts memory performance. Thus, it would be desirable to reduce the capacitive coupling effects to obtain enhanced performance of sensing schemes.

SUMMARY

The present disclosure provides structures and techniques for reducing cross talk between bit lines, i.e., bit line to bit line capacitance, in a non-volatile storage system. A conventional memory structure typically includes arrays of memory elements formed on a semiconductor substrate, with bit lines formed at a 2f pitch in a single metal layer over the arrays. However, by forming the bit lines at a 4f pitch in two separate metal layers, and alternating the bit lines between each of the metal layers, capacitance is reduced and performance is improved. Thus, a first set of bit lines is formed in a first metal layer in correspondence with a first set of non-volatile storage elements, and a second set of bit lines is formed in a second metal layer over the first metal layer in correspondence with a second set of non-volatile storage elements. The first and second sets of bit lines are arranged in an alternating manner; that is, the first set of bit lines is arranged to connect with alternating columns of storage elements, and the second set of bit lines is arranged to connect with the remaining alternating columns of storage elements which are not arranged to connect to the first set of bit lines.

In an alternative embodiment, the bit lines are formed to alternate as in the first embodiment, but in addition, grounding shields are formed between each of the bit lines on each metal layer such bit lines and shields alternate on each metal layer. Thus, the shields in the first metal layer are positioned in correspondence with the bit lines in the second metal layer, and the shields in the second metal layer are positioned in correspondence with the bit lines in the first metal layer. Thus, the metal lines are formed at a pitch of 2f in each metal layer, but are alternately used as bit lines and shields. Contact blocks are formed to provide connections to the storage elements at regular intervals, for example, one for every two blocks of storage elements, and the shields are preferably formed in segments between each of the contact blocks. The shields in the first metal layer are connected to a ground potential, and the shields in the second metal layer are connected to a source potential.

In another variation, the bit lines are formed to be wider between the contact blocks and narrower proximate to the contact blocks.

A better understanding of the features and advantages of the present invention will be obtained by reference to the following detailed description of the invention and the accompanying drawings which set forth an illustrative embodiment in which the principles of the invention are utilized.

BRIEF DESCRIPTION OF THE DRAWINGS

FIGS. 9A-9E are cross-sectional views of a portion of a memory array illustrating the formation of another alternative bit line arrangement on top of the memory array.

DETAILED DESCRIPTION

The present disclosure relates to a non-volatile memory structure having bit lines formed in multiple metal layers over the memory structure. In one embodiment, bit lines are formed at lower densities by alternating adjacent bit lines in different metal layers thereby reducing cross talk between the bit lines. In another embodiment, the bit lines are again alternated between the different metal layers, but shields are provided between each of the bit lines on each metal layer.

An exemplary memory system suitable for incorporating the bit line structures disclosed herein uses the NAND flash memory structure, which includes arranging multiple transistors in series between two select gates. The transistors in series and the select gates are considered a NAND string. For example, FIG. 1 is a top view showing one NAND string 150, and FIG. 2 is an equivalent circuit thereof.

Figure 1:
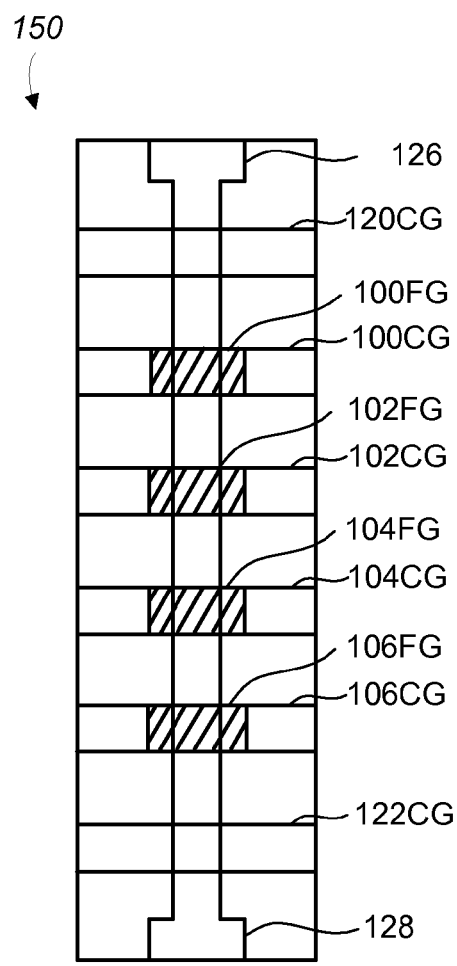
FIG. 1 is a top plan view of a NAND memory string.
Figure 2:
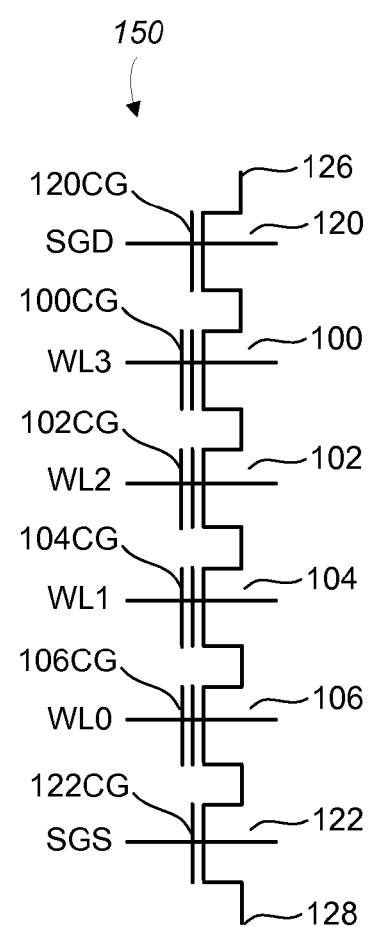
FIG. 2 is an equivalent circuit diagram of the NAND memory string of FIG. 1.

The NAND string 150 depicted in FIGS. 1 and 2 includes four transistors, 100, 102, 104 and 106, arranged in series between a bit select gate 120 and a source select gate 122. Bit select gate 120 gates the connection of the NAND string 150 to bit line 126, and a source select gate 122 gates the connection of the NAND string to source line 128. Bit select gate 120 is connected to select line SGD and is controlled by applying the appropriate voltages to control gate 120CG. Source select gate 122 is connected to select line SGS and is controlled by applying the appropriate voltages to control gate 122CG.

Each of the four transistors 100, 102, 104 and 106 has a control gate and a floating gate. Transistor 100 has control gate 100CG and floating gate 100FG. Transistor 102 includes control gate 102CG and floating gate 102FG. Transistor 104 has control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, each of transistors 100, 102, 104 and 106 is one memory cell, and thus the illustrated NAND string 150 has four memory cells, although this is provided as an example and is not intended to be limiting. NAND strings could be formed to include a different number of memory cells, such as 8, 16, 32, 64, etc. In other embodiments, the memory cells may include multiple transistors or may be arranged differently than the example depicted in FIGS. 1 and 2.

Each memory cell can store data represented in analog or digital form. When storing one bit of digital data, the possible threshold voltages of the memory cell are divided into two ranges, which are assigned the logical data values "1" and "0." In one example of a NAND-type flash memory, the threshold voltage is negative after the memory cell is erased, and this state is defined as logic "1." The threshold voltage is positive after a program operation, and this state is defined as logic "0." When the threshold voltage is negative and a read is attempted by applying 0 volts to the control gate, the memory cell turns on to indicate logic 1 is stored. When the threshold voltage is positive and a read operation is attempted by applying 0 volts to the control gate, the memory cell does not turn on, which indicates that logic 0 is stored. A memory cell storing one bit of digital data is referred to as a binary memory cell.

A memory cell can also store multiple bits of digital data, and such a cell is referred to as a multi-state or multi-level memory cell. The threshold voltages for a multi-state memory cell are divided into a number of states. For example, if four states are used, there will be four distinct ranges or distributions of threshold voltages, which are assigned the logical data values "11," "10," "01," and "00." In one example of a NAND-type memory having four states, the threshold voltage after an erase operation is negative and defined as the logic "11." Three distinct ranges of positive threshold voltages are defined as logic "10," "01," and "00."

Examples of NAND-type flash memories and their operation are provided in the following patents, all of which are incorporated herein by reference in their entirety: U.S. Pat. Nos. 5,386,422; 5,570,315; 5,774,397; 6,046,935; 6,456,528; and 6,522,580.

Another type of memory cell useful in flash EEPROM systems utilizes a non-conductive dielectric material in place of a conductive floating gate to store charge in a non-volatile manner. Such a cell is described in an article by Chan et al., "*A True Single-Transistor Oxide-Nitride-Oxide EEPROM Device*," IEEE Electron Device Letters, Vol. EDL-8, No. 3, March 1987, pp. 93-95. A triple layer dielectric is formed of silicon oxide, silicon nitride and silicon oxide ("ONO") and is sandwiched between a conductive control gate and a surface of a semiconductor substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See the article by Nozaki et al., "*A 1-Mb EEPROM with MONOS Memory Cell for Semiconductor Disk Application*," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "*Nonvolatile Semiconductor Memory Technology*," edited by William D. Brown and Joe E. Brewer, IEEE Press, 1998, incorporated herein by reference, are also described in that section to be applicable to dielectric charge-trapping devices. The memory cells described above can also incorporate the bit line structures disclosed herein.

Another approach to storing two bits in each cell has been described by in an article by Eitan et al., "*NROM: A Novel Localized Trapping, 2-Bit Nonvolatile Memory Cell*," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. The memory cells described in this paragraph can also incorporate the disclosed bit line structures.

Figure 3:
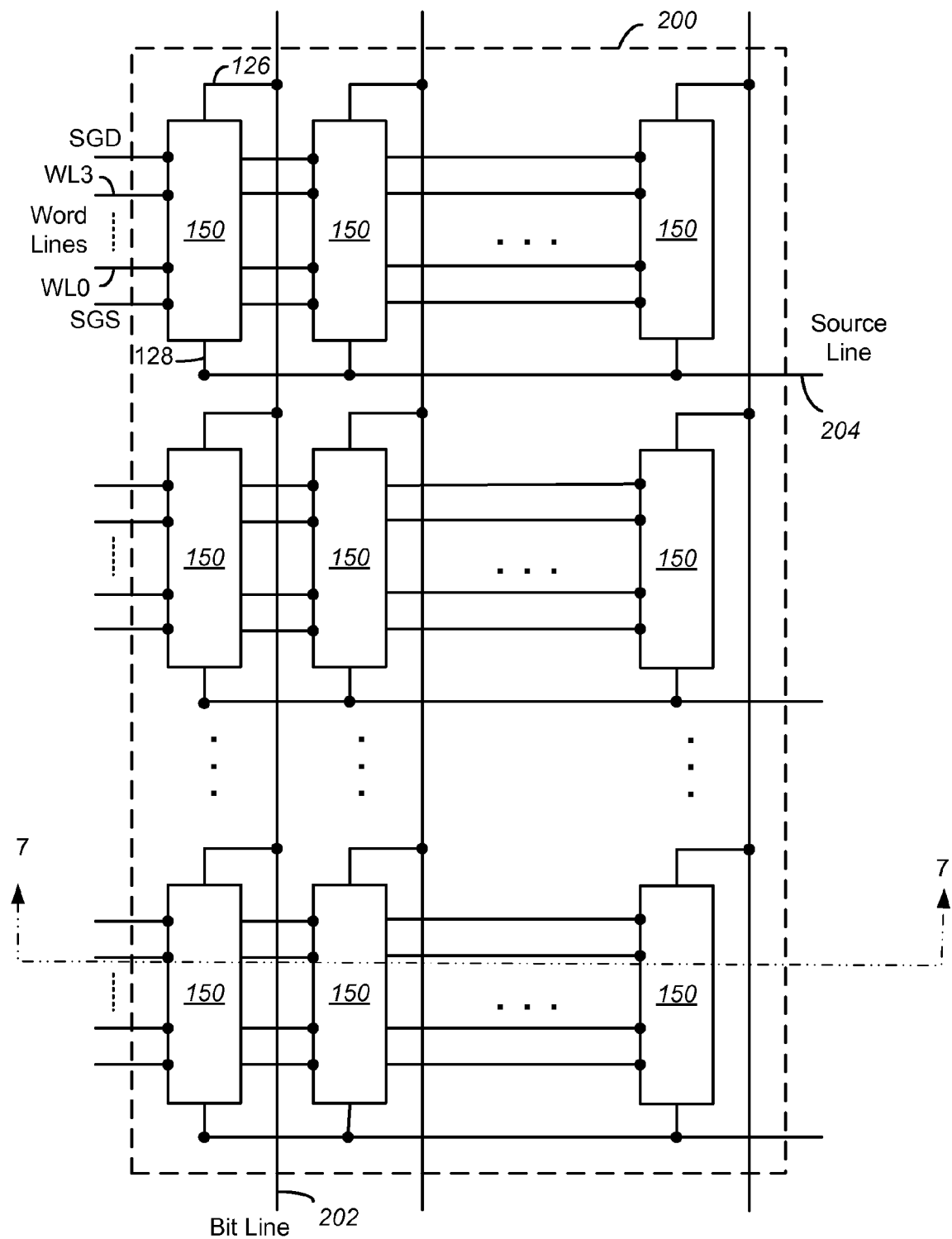
FIG. 3 is a block diagram illustrating a portion of a NAND flash memory array.

FIG. 3 illustrates a typical array 200 of NAND strings 150. Along each column, a bit line 202 is coupled to the drain regions 126 of select gates 120. The subject of this disclosure is the formation of these bit lines in multiple metal layers over the array 200, as described below. Along each row, a source line 204 may be coupled to the source regions 128 of select gates 122. Examples of a NAND architecture array and its operation as part of a memory system may be found in U.S. Pat. Nos. 5,570,315, 5,774,397, and 6,046,935.

The memory array 200 is typically divided into a large number of blocks of memory cells. In one embodiment, the block is the unit of erase, i.e., each block contains some minimum number of memory cells that are erased together. Each block is typically divided into a number of pages. In one embodiment, the page is the unit of programming. In one embodiment, the individual pages may be divided into segments, and the segments may contain the fewest number of cells that are written at one time for a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored on different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 4:
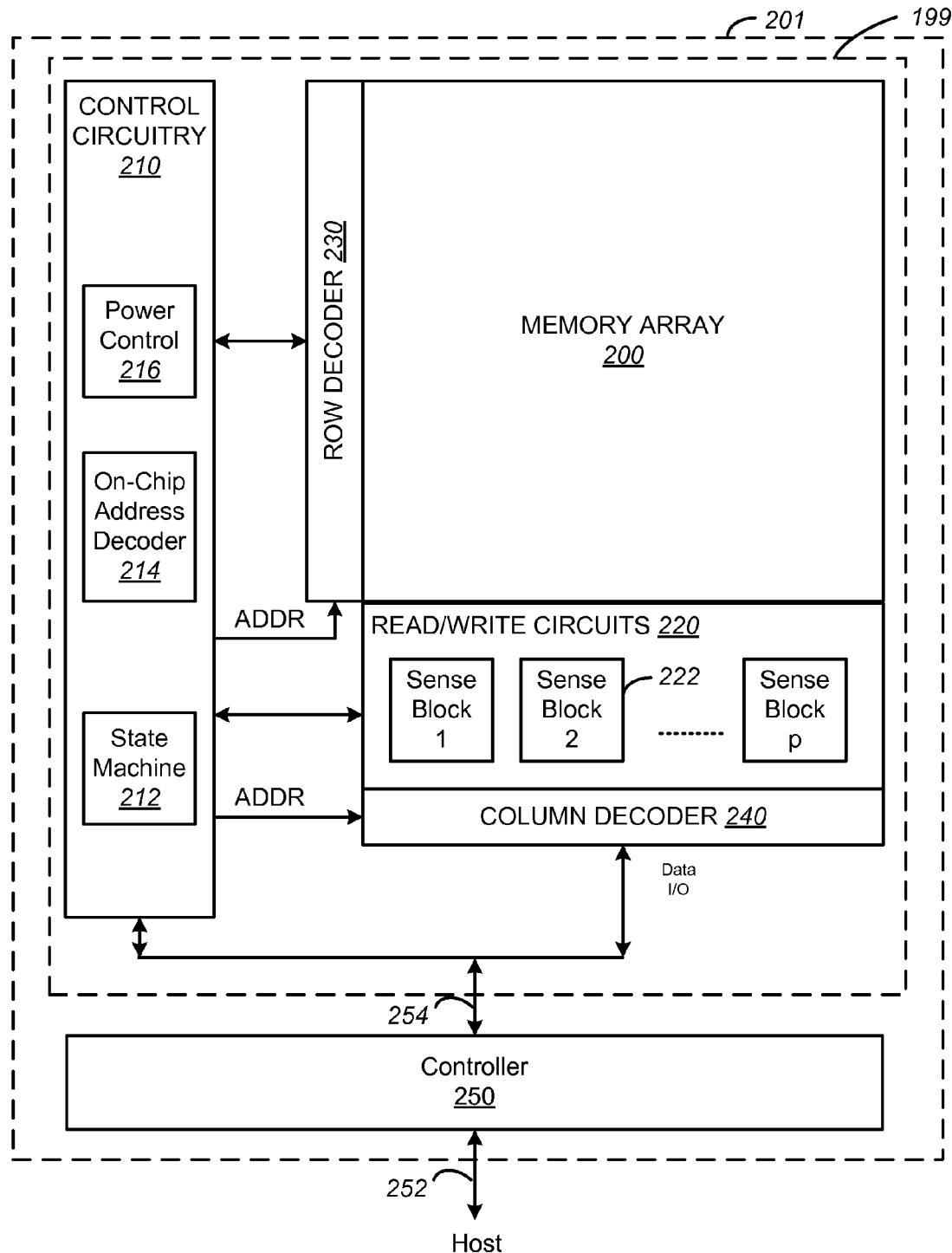
FIG. 4 is a block diagram of a non-volatile memory system.

FIG. 4 illustrates one embodiment of a memory device 201 having read/write circuits for reading and programming a page of memory cells in parallel. Memory device 201 may include one or more memory die 199. Memory die 199 includes a two-dimensional array of memory cells 200, such as shown in FIG. 3, as well as control circuitry 210, and read/write circuits 220. In some embodiments, the array of memory cells can be three dimensional. The memory cells in array 200 are controlled and accessed by various control lines, such as bit lines, word lines, source lines, and other lines used to control the memory array. For example, the memory array 200 is addressable by word lines via a row decoder 230 and by bit lines via a column decoder 240. The read/write circuits 220 include multiple sense blocks 222 and allow a page of memory cells to be read or programmed in parallel. Typically a controller 250 is included in the same memory device 201 (e.g., a removable storage card) as the one or more memory die 199. Commands and data are transferred between the host and controller 250 via lines 252 and between the controller and the one or more memory die 199 via lines 254.

The control circuitry 210 cooperates with the read/write circuits 220 to perform memory operations on the memory array 200. The control circuitry 210 includes a state machine 212, an on-chip address decoder 214 and a power control module 216. The state machine 212 provides chip-level control of memory operations. The on-chip address decoder 214 provides an address interface between that used by the host 252 or a memory controller to the hardware address used by the decoders 230 and 240. The power control module 216 controls the power and voltages supplied to the word lines and bit lines during memory operations.

Figure 5:
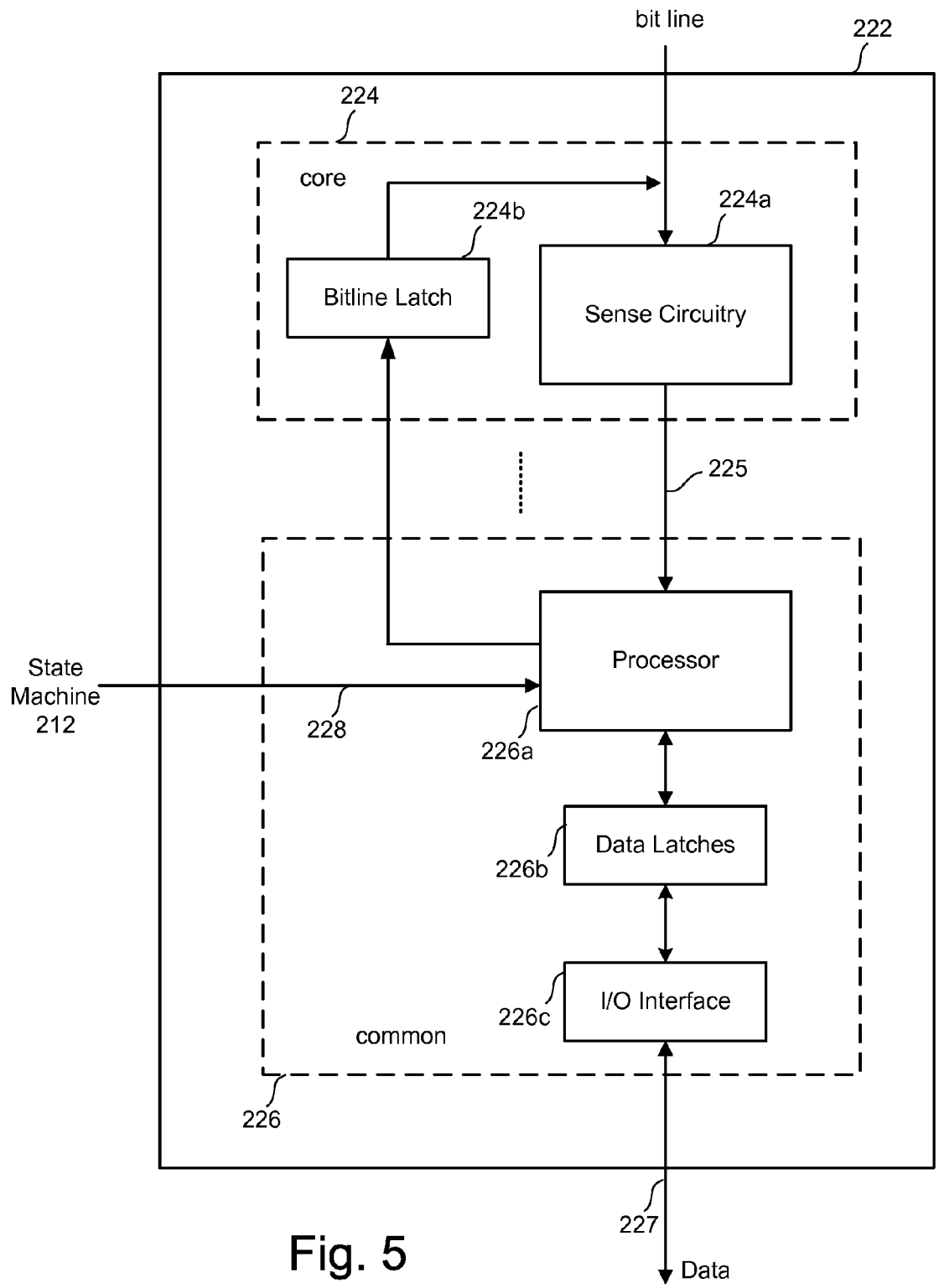
FIG. 5 is a block diagram showing one embodiment of the sense block of FIG. 4.

FIG. 5 is a block diagram of an individual sense block 222 partitioned into a core portion, referred to as a sense module 224, and a common portion 226. In one embodiment, there is a separate sense module 224 for each bit line and one common portion 226 for a set of multiple sense modules 224. In one example, a sense block includes one common portion 226 and eight sense modules 224. Each of the sense modules 224 in a group will communicate with the associated common portion via a data bus 225. For further details, refer to U.S. Patent Publication No 2006/0140007 entitled Non-Volatile Memory & Method with Shared Processing for an Aggregate of Sense Amplifiers, which is incorporated herein by reference in its entirety.

Sense module 224 includes sense circuitry 224a that determines whether a conduction current in a connected bit line is above or below a predetermined threshold level. Sense module 224 also includes a bit line latch 224b that is used to set a voltage condition on the connected bit line. For example, a predetermined state latched in bit line latch 224b will result in the connected bit line being pulled to a program inhibit state (e.g., $V_{dd}$).

Common portion 226 comprises a processor 226a, a set of data latches 226b and an I/O interface 226c coupled between the set of data latches and data bus 227. Processor 226a performs computations. For example, one of its functions is to determine the data stored in the sensed memory cell and to store the determined data in the set of data latches 226b. The set of data latches 226b is used to store data bits determined by processor 226a during a read operation. It is also used to store data bits imported from the data bus 227 during a program operation. The imported data bits represent write data meant to be programmed into the memory. I/O interface 226c provides an interface between data latches 226b and the data bus 227.

During read or sensing, the operation of the system is under the control of state machine 212 that controls the supply of different control gate voltages to the addressed cell. As it steps through the various predefined control gate voltages corresponding to the various memory states supported by the memory, the sense module 224 may trip at one of these voltages and an output will be provided from sense module 224 to processor 226a via bus 225. At that point, processor 226a determines the resultant memory state by consideration of the tripping event(s) of the sense module 224 and the information about the applied control gate voltage from the state machine 212 via input lines 228. It then computes a binary encoding for the memory state and stores the resultant data bits into data latches 226b. In another embodiment of the core portion, bit line latch 224b serves double duty, both as a latch for latching the output of the sense module 224 and also as a bit line latch 226b as described above.

It is anticipated that some implementations will include multiple processors 226a. In one embodiment, each processor 226a will include an output line (not shown) and each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic 0 for that bit will be sent to the wired-OR line (or a logic 1 if inverted). When all bits output a 0, then the state machine 212 knows to terminate the programming process. Because each processor 226a communicates with eight sense modules 224, the state machine 212 needs to read the wired-OR line eight times, or logic is added to processor 226a to accumulate the results of the associated bit lines such that the state machine need only read the wired-OR line one time. Similarly, by choosing the logic levels correctly, the global state machine 212 can detect when the first bit changes its state and change the algorithms accordingly.

During program or verify, the data to be programmed is stored in the set of data latches 226b from the data bus 227. The program operation, under the control of the state machine 212, comprises a series of programming voltage pulses applied to the control gates of the addressed memory cells. Each programming pulse is followed by a verify operation to determine if the memory cell has been programmed to the desired state. Processor 226a monitors the verified memory state relative to the desired memory state. When the two are in agreement, the processor 226a sets the bit line latch 224b so as to cause the bit line to be pulled to a state designating program inhibit such as Vdd. This inhibits the cell coupled to the bit line from further programming even if programming pulses appear on its control gate. In other embodiments, the processor 226a initially loads the bit line latch 224b and the sense circuitry 224a sets it to an inhibit value during the verify process.

In one embodiment, there are three data latches 226b per sense module 224. In some implementations, the data latches 226b are implemented as a shift register so that the parallel data stored therein is converted to serial data for data bus 227, and vice versa. In a preferred embodiment, all the data latches 226b corresponding to the read/write block 222 of memory cells can be linked together to form a block shift register so that a block of data can be input or output by serial transfer. In particular, the bank of read/write modules is adapted so that each of its set of data latches 226b will shift data into or out of the data bus 227 in sequence as if they are part of a shift register for the entire read/write block 222.

Additional information about the structure and/or operations of various embodiments of non-volatile storage devices can be found in the following patent documents, which are incorporated herein by reference in their entirety: U.S. Pat. No. 7,023,736 entitled Non-Volatile Memory And Method with Improved Sensing; U.S. Pat. No. 7,046,568 entitled Improved Memory Sensing Circuit And Method For Low Voltage Operation; U.S. Patent Publication No. 2004/0057287 entitled Non-Volatile Memory And Method With Reduced Source Line Bias Errors; U.S. Patent Publication No. 2006/0221692 entitled Compensating for Coupling During Read Operations of Non-Volatile Memory; and U.S. Patent Publication No. 2006/0158947 entitled Reference Sense Amplifier For Non-Volatile Memory.

Figure 6:
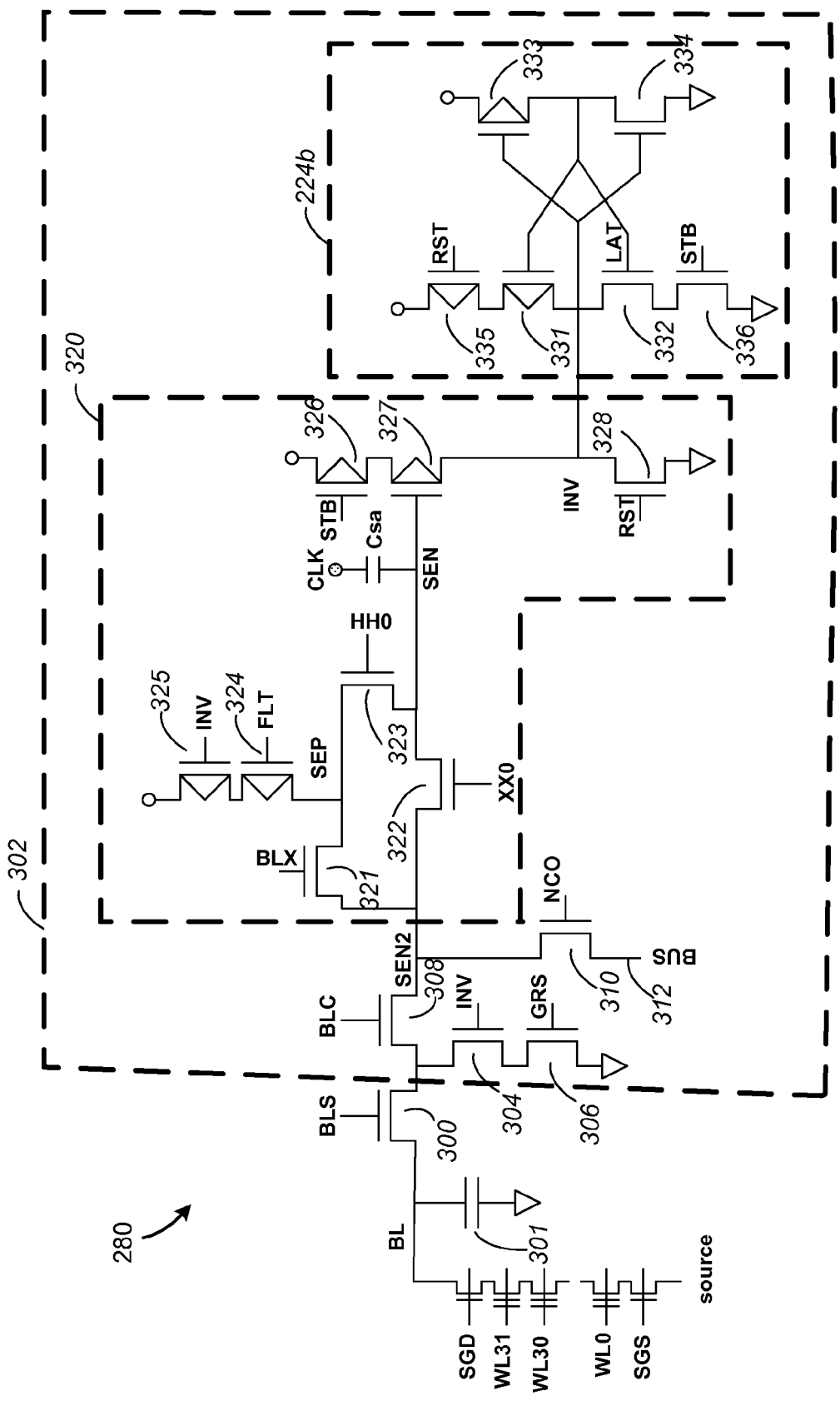
FIG. 6 is a schematic diagram showing one embodiment of a sense module.

FIG. 6 illustrates one example of sense module 280. Sense module 280 comprises a bit line isolation transistor 300 coupled to a bit line pull down circuit 302. The bit line pull down circuit 302 includes transistors 304 and 306, bit line voltage clamp transistor 308, readout bus transfer gate 310, sense amplifier 320 and bit line latch 224b. One side of bit line isolation transistor 300 is connected to the bit line BL, and the capacitance on the bit line BL is represented by capacitor 301. The other side of bit line isolation transistor 300 is connected to bit line voltage clamp transistor 308 and bit line pull down transistor 304. The gate of bit line isolation transistor 300 receives a signal labeled as BLS. The gate of bit line voltage clamp transistor 308 receives a signal labeled as BLC. Bit line voltage clamp transistor 308 is connected to readout bus transfer gate 340 at node SEN2. Readout bus transfer gate 310 is connected to readout bus 312. Bit line voltage clamp transistor 308 connects to sense amplifier 320 at node SEN2. In the embodiment of FIG. 6, sense amplifier 320 includes transistors 321, 322, 323, 324, 325, 326, 327 and 328, as well as capacitor Csa. Bit line latch 224b includes transistors 331, 332, 333, 334, 335 and 336.

In general, memory cells along a word line are operated on in parallel. Therefore a corresponding number of sense modules are in operation in parallel. In one embodiment, a controller provides control and timing signals to the sense modules operating in parallel. In some embodiments, data along a word line is divided into multiple pages, and the data is read or programmed one page at a time, or multiple pages at a time.

Sense module 280 is connected to the bit line BL when the bit line isolation transistor 300 is enabled by signal BLS. Sense module 280 senses the conduction current of the memory cell by means of sense amplifier 320 and latches the read result as a digital voltage level at sense node SEN2 and outputs it to readout bus 312 via gate 310.

The sense amplifier 320 includes a second voltage clamp (transistors 321 and 322), a pre-charge circuit (transistors 323, 324 and 325), and a discriminator or compare circuit (transistors 326, 327 and 328; and capacitor Csa). In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off transition may be a continuous transition so that the memory cell will conduct different currents in response to different control gate voltages. If the memory cell is on and conducting current, the conducted current will cause the voltage on node SEN to decrease. If the voltage on node SEN discharges to a predetermined level during a predetermined sensing period, then sense amplifier 320 reports that the memory cell turned on in response to the control gate voltage.

One feature of the sense module 280 is the incorporation of a constant voltage supply to the bit line during sensing. This is preferably implemented by the bit line voltage clamp transistor 308, which operates like a diode clamp with transistor 308 in series with the bit line BL. Its gate is biased to a constant voltage BLC equal to the desired bit line voltage VBL above its threshold voltage VT. In this way, it isolates the bit line from the node SEN and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

Sense amplifier 320 senses the conduction current through the sense node SEN and determines whether the conduction current is above or below a predetermined value. The sense amplifier 320 outputs the sensed result in a digital form as the signal SEN2 to readout bus 312.

The digital control signal INV, which is essentially an inverted state of the signal at SEN2, is also output to control the pull down circuit. When the sensed conduction current is higher than the predetermined value, INV will be HIGH and SEN2 will be LOW. This result is reinforced by the pull down circuit 302. The pull down circuit 302 includes an n-type transistor 304 controlled by the control signal INV and another n-type transistor 306 controlled by the control signal GRS. The GRS signal when LOW allows the bit line BL to be floated regardless of the state of the INV signal. During programming, the GRS signal goes HIGH to allow the bit line BL to be pulled to ground and controlled by INV. When the bit line BL is required to be floated, the GRS signal goes LOW. Note that other designs of sense modules, sense amplifiers and latches can also be used.

Read/write circuits 220 operate on a page of memory cells simultaneously. Each sense module 280 in the read/write circuits 220 is coupled to a corresponding cell via a bit line. The conduction current flows from the sense module 280 through the bit line into the drain of the memory cell and out from the source before going through a source line to ground. In an integrated circuit chip, the sources of the cells in a memory array 200 are all tied together as multiple branches of the source line connected to some external ground pad (e.g., Vss) of the memory chip. Even when metal strapping is used to reduce the resistance of the source line, a finite resistance remains between the source electrode of a memory cell and the ground pad. Typically, the ground loop resistance is about 50 ohms.

When a memory cell is sensed, the bit line is discharged throughout the period of time that current is being integrated. If the cell is on, the bit line voltage will drop substantially. If the cell is off, the bit line voltage will stay more or less the same as it was in the precharge state.

In order to avoid bit line to bit line crosstalk, the global bit lines are charged together and maintained at their respective voltages. Even when a particular memory cell is turned on, the global bit line 202 does not come down—it is the voltage at node SEN of capacitor Csa that collapses. Thus, there is conflict that results in current consumption as the cell being sensed tries to drain the bit line voltage while the sense amp 280 trys to maintain the bit line voltage.

The sensing capacitor Csa is much smaller that a conventional sensing capacitor. Therefore, it goes through a bigger voltage excursion when the cell turns on, i.e., the voltage drops substantially. One end of capacitor Csa is connected to a clock CLK (DC voltage) during the integration time, and the other end is the sense node SEN. At the end of the integration period, the voltage at sense node SEN is compared to a trip point. If the voltage is above the trip point, the cell is considered on, and if the voltage is below the trip point, the cell is considered off.

In one embodiment, sensing is carried out in a two phase operation. During a first strobe period, the scheme looks for cells that are grossly on, i.e., the control gate voltage is substantially above the threshold voltage of those cells. This is determined by evaluating the conduction current at node SEN. An exemplary trip point for gross current sensing is 500 na. During a second strobe period, a finer comparison is made, for example, by setting a trip point for current sensing at 140 na.

In a conventional sensing scheme, the integration period may be on the order of several microseconds since enough time is needed for the entire bit line voltage to come down, and this takes some time because the capacitance is very large. In the present scheme, however, because the sense capacitor Csa is much smaller than the capacitance of the global bit line 202, less time is needed to obtain a change in voltage, i.e., I=C(dV/dt), and since the capacitance is smaller, the voltage can be affected in a smaller time period with the same cell current.

Thus, when a group of cells is sensed as being on in a first strobe period, the bit lines for those cells are shut down so that they are not sensed again. This is done by bringing the bit lines down as previously described. However, when the bit lines are brought down, bit line to bit line capacitive crosstalk may be induced, and therefore a waiting period is needed to recover from the bit line to bit line crosstalk.

As previously noted, when the bit line is being pulled down, the sense amp 280 wants to replenish the charge. Thus, the bit line actually droops down for a short transient time, then climbs back up to its normal level. This transient wait time is approximately 4.4 microseconds in one embodiment. During this wait time, all the bit lines that have not been shut down are still conducting. All this current is directed into the top metal layer, or cell source mesh, and eventually drains to ground. However, because so many cells are being read, the cell source mesh may become overloaded, and instead of going to ground, it may go to 300 mV. This is considered a body effect. The threshold voltage Vt is a function is the voltage of the cell source mesh less the voltage from the body effect. The presence of the body effect can cause read errors by changing the threshold voltage. To avoid this, the two phase sensing scheme is used. During the first strobe period, the scheme senses cells that are grossly on. After a waiting period (e.g. 4.4 ms), the second strobe period is initiated.

Thus, if one is able to reduce bit line to bit line cross talk capacitance, then the effect that one bit line creates on the other is alleviated, so it takes less time to recover from it, and less energy per bit read, so a gain in performance and savings of energy per bit read can be achieved.

Recognizing that most of the bit line capacitances are derived from immediate neighbors, one embodiment of the present disclosure in effect seeks to move the immediate neighbors farther away, while another embodiment seeks to create shields between immediate neighbors.

Figure 7:
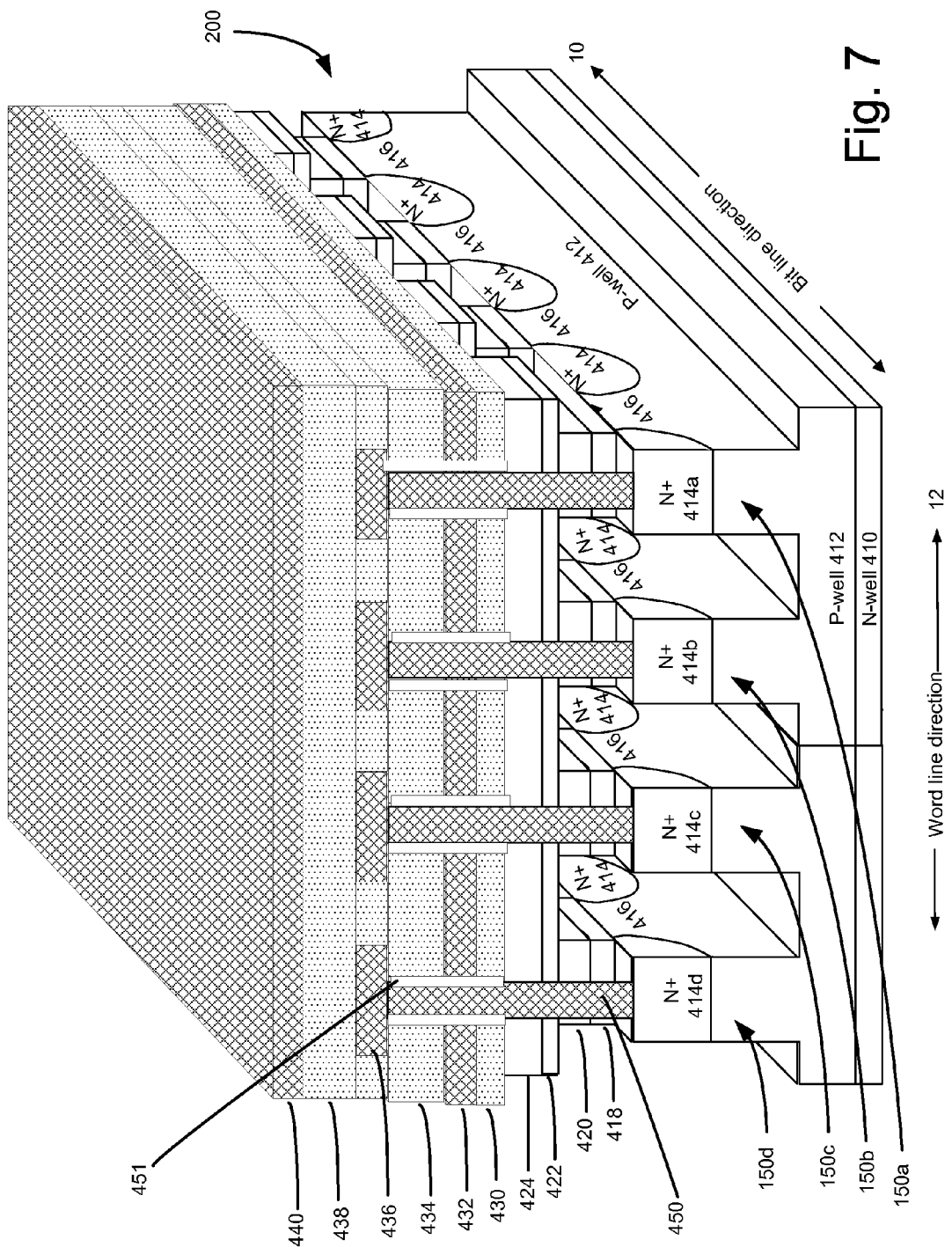
FIG. 7 is cross-sectional view of the memory array of FIG. 3 taken across section 7-7 illustrating a conventional bit line arrangement.

FIG. 7 is a simplified three-dimensional cross-section of a portion of the array 200 of NAND strings 150 shown in FIG. 3 taken across section 7-7 and includes the metal and insulating layers which are formed over the top of the array in a conventional manner. Thus, only four parallel NAND strings 150a, 150b, 150c, and 150d are illustrated, although a typical memory array will include millions of memory cells, and the illustrated portion of the array 200 is considered representative of the entire array. Each NAND string extends in the bit line direction, as indicated by arrow 10.

The elements of the memory array 200 are formed in a well known manner using conventional semiconductor processing techniques. For example, the basic arrangement includes a triple well having a P-type substrate (not shown), an N-type well 410 formed over the substrate, and a P-type well 412 formed over the N-type well. A large number of N+-type doped regions 414 are formed within the P-type well 412. For example, each of the N+-type doped regions 414a, 414b, 414c, 414d, serves as a source/drain region for a NAND string select gate transistor, such as select gate 120 or select gate 122 in FIG. 2. Whether N+-type doped regions 414 are labeled as source regions or drain regions is somewhat arbitrary. N+-type doped region 514 serves as the source/drain region of the select gate transistor 414a, which corresponds to select gate 120 in FIG. 2, as well as the source/drain region of memory cell 470, which corresponds to memory cell 100 in FIG. 2. N+-type doped region 614 serves as the source/drain region of memory cell 472 as well as the source/drain region of memory cell 470, which corresponds to memory cell 102 in FIG. 2. N+-type doped region 714 serves as the source/drain region of memory cell 472 as well as the source/drain region of memory cell 474, which corresponds to memory cell 104 in FIG. 2. N+-type doped region 814 serves as the source/drain region of memory cell 474 as well as the source/drain region of the next memory cell (not shown), which corresponds to memory cell 106 in FIG. 2.

A channel 416 is defined between the N+ doped regions 414 in each NAND string 150. The channel labeled 416a separates the NAND string select gate transistor, such as select gate 120 in FIG. 2, from the first memory cell. A first dielectric layer 418 is formed over the channel 416, and a conductive layer 420 is formed over the dielectric layer 418. The dielectric layer 418 may be silicon oxide, silicon nitride, high-dielectric film, or any other suitable insulating material. The conductive layer 420 may be any conducting material known in the art, including highly-doped poly silicon, tantalum, titanium, tungsten, copper, cobalt, or alloys thereof. These layers 418, 420 are appropriately patterned and etched using a suitable process to form discrete rectangular parallel structures located over each channel 416 in each NAND string. Suitable barrier layers may be incorporated, for example, to prevent reaction between a tungsten layer and silicon. The conductive layer 420 acts as a floating gate for corresponding memory cells in each NAND string, such as cells 470, 472 and 474.

A second dielectric layer 422 is formed above the conductive layer 420 to extend across the entire array 200. A second conductive layer 424 in formed over the dielectric layer 422 and extends across the array 200. For each select gate transistor, such as transistors 120 and 122 shown in FIG. 2, the dielectric layer 422 is patterned and etched to form vias (not shown) that are back-filled to connect conductive layer 424 to conductive layer 420. This allows the select gate transistors to act as transistors instead of memory cells. The layers 422, 424 are appropriately patterned and etched to create a discrete structure that extends over each row of the array 200 in each NAND string, in the word line direction, as indicated by arrow 12. The conductive layer 424 acts as a control gate for corresponding memory cells. Interconnections to source/drain regions 414 for each NAND string are formed using well known processes. For example, masks are used to pattern and then etch one or more layers to create holes or vias 450. A barrier layer 451 may be formed to protect the periphery of the via, and then a metal plug is formed within the barrier layer inside the via for that layer. In other embodiments, various layers may be interspersed within or added to the illustrated layers.

It is noted that for simplicity, an empty space is shown between each of the NAND strings 150a-150d and under the metal and insulating layers. As a practical matter, insulating or shielding layers are typically formed between each NAND string to maintain electrical isolation between each string.

Another dielectric layer 430 is formed over the conductive control gate layer 424 and extends over the entire array 200. A first metal layer 432, commonly called the "metal 0" layer, is formed over the dielectric layer 430, and extends over the entire array 200. The metal 0 layer 432 may be formed from tungsten and is typically used to provide local interconnections (not shown). A dielectric layer 434 is formed over the metal 0 layer 432 and extends over the entire array 200. A second metal layer 436, otherwise known as the "metal 1" layer, is formed over the dielectric layer 434 and patterned to create discrete, parallel metal structures extending over each column of the array 200 in the bit line direction for each NAND string. Further, each discrete parallel metal structure 436 acts as a bit line 202. Thus, the bit lines are effectively formed at a pitch of 2f, or twice the feature size. In addition, the metal deposited at this step is filled into vias 450 to make contact between the bit lines and drain regions 414a, 414b, 414c, and 414d. Typically, the metal 1 layer is copper. A dielectric layer 438 is formed over the metal 1 layer 436 and extends over the entire array 200, as well as filling in between the bit lines. Finally, a third metal layer 440, or "metal 2," is formed over the dielectric layer 438, and is typically aluminum.

In one embodiment using a 56 nm architecture, the thickness of the metal 0 and metal 2 layers is approximately 100 nm, the thickness of the bit lines in the metal 1 layer is approximately 80 nm, and the thickness of the insulating layers between metal layers is approximately 250 nm.

Figure 8A:
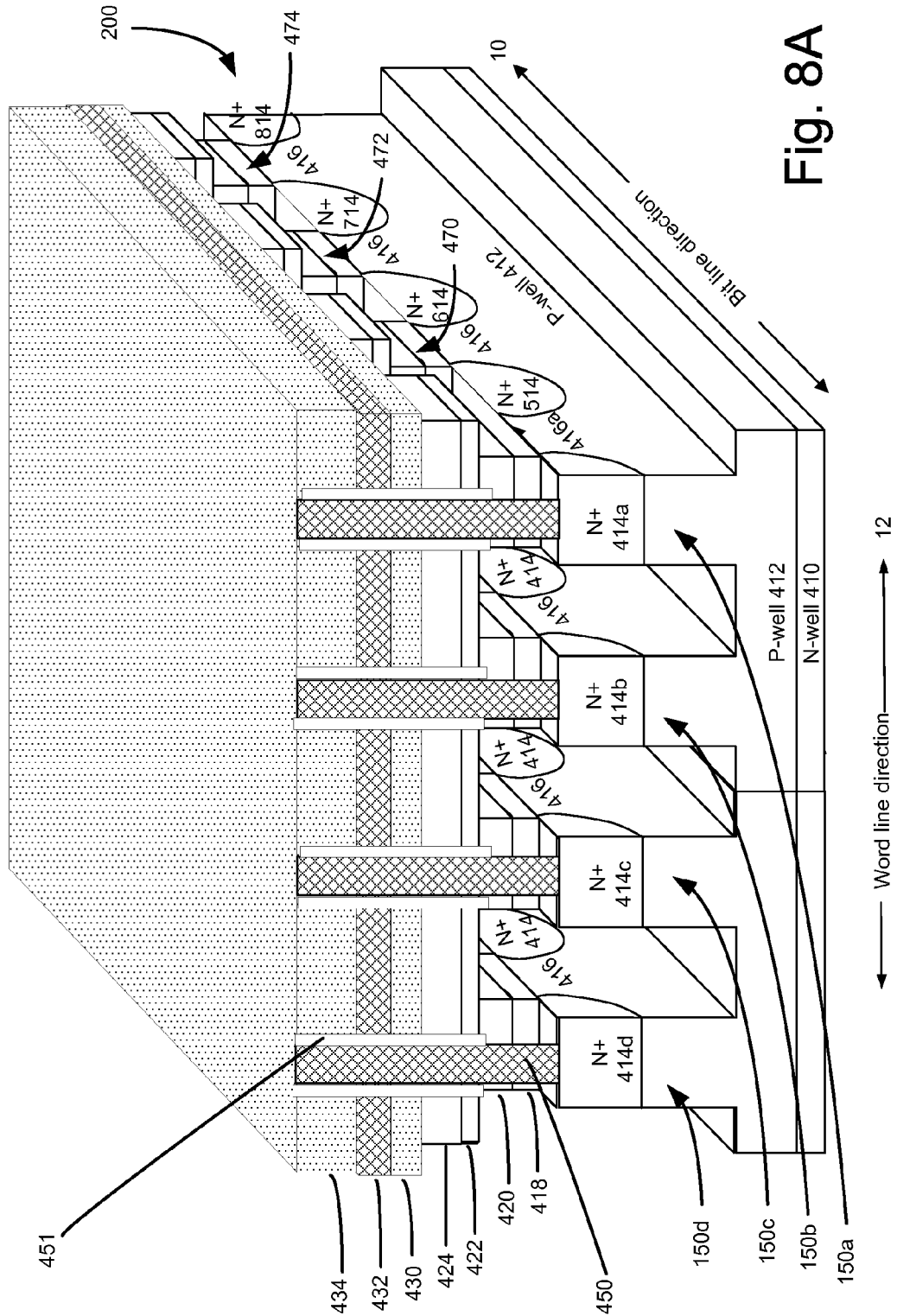
FIGS. 8A-8E are cross-sectional views of a portion of a memory array illustrating the formation of an alternative bit line arrangement on top of the memory array.

Referring now to FIGS. 8A-8E, a first embodiment of a bit line structure formed in different metal layers will be described. FIG. 8A shows a three-dimensional cross-section of a portion of the array 200, which is identical to that of FIG. 7 from the dielectric layer 434 downward. Thus, as in FIG. 7, four parallel NAND strings 150a, 150b, 150c, and 150d are illustrated. The memory cells are formed just as in FIG. 7, with the top element of the memory cell stack being the word lines or conductive control gate layer 424.

A dielectric layer 430 and a first metal layer 432 (metal 0) are formed over the control gate layer 424 extending over the entire array 200, as in FIG. 7. Also, a dielectric layer 434 is formed over the metal 0 layer 432 and extends over the entire array 200. As before, the dielectric layers are patterned and etched to open holes or vias 450, then barrier layers 451 are formed within the vias, then plugs are formed within the barrier layers.

Figure 8B:
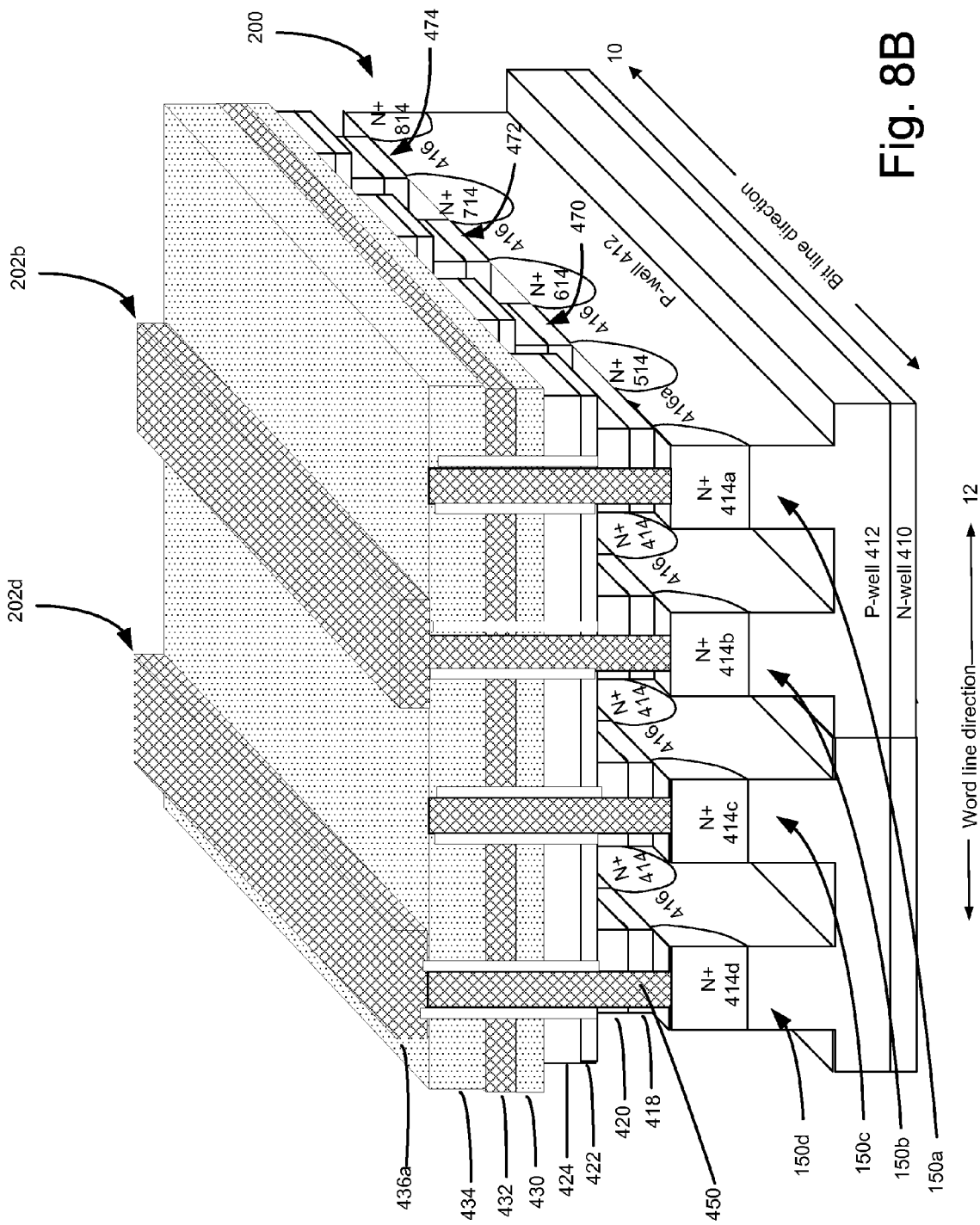

In FIG. 8B, the second metal layer 436a (metal 1) is formed over the dielectric layer 434 and patterned to create discrete, parallel metal structures. In addition, the metal layer 436a back fills the vias 450 to make contact between the bit lines and corresponding drain regions, for example, bit lines 202b, 202d are coupled to drain regions 414b, 414d, respectively. However, in this embodiment, the metal structures are formed to correspond with every other column of array 200, instead of every column, so that bit line 202b corresponds to NAND string 150b and bit line 202d corresponds to NAND string 150d. Thus, the bit lines 202b and 202d are formed in the metal 1 layer 436a at a lower density than in FIG. 7, i.e., at a pitch of 4f instead of 2f. In addition, the metal 1 layer 436a back fills the vias 450 to make contact between the bit lines and corresponding drain regions, for example, bit lines 202b, 202d are coupled to drain regions 414b, 414d, respectively.

Figure 8C:
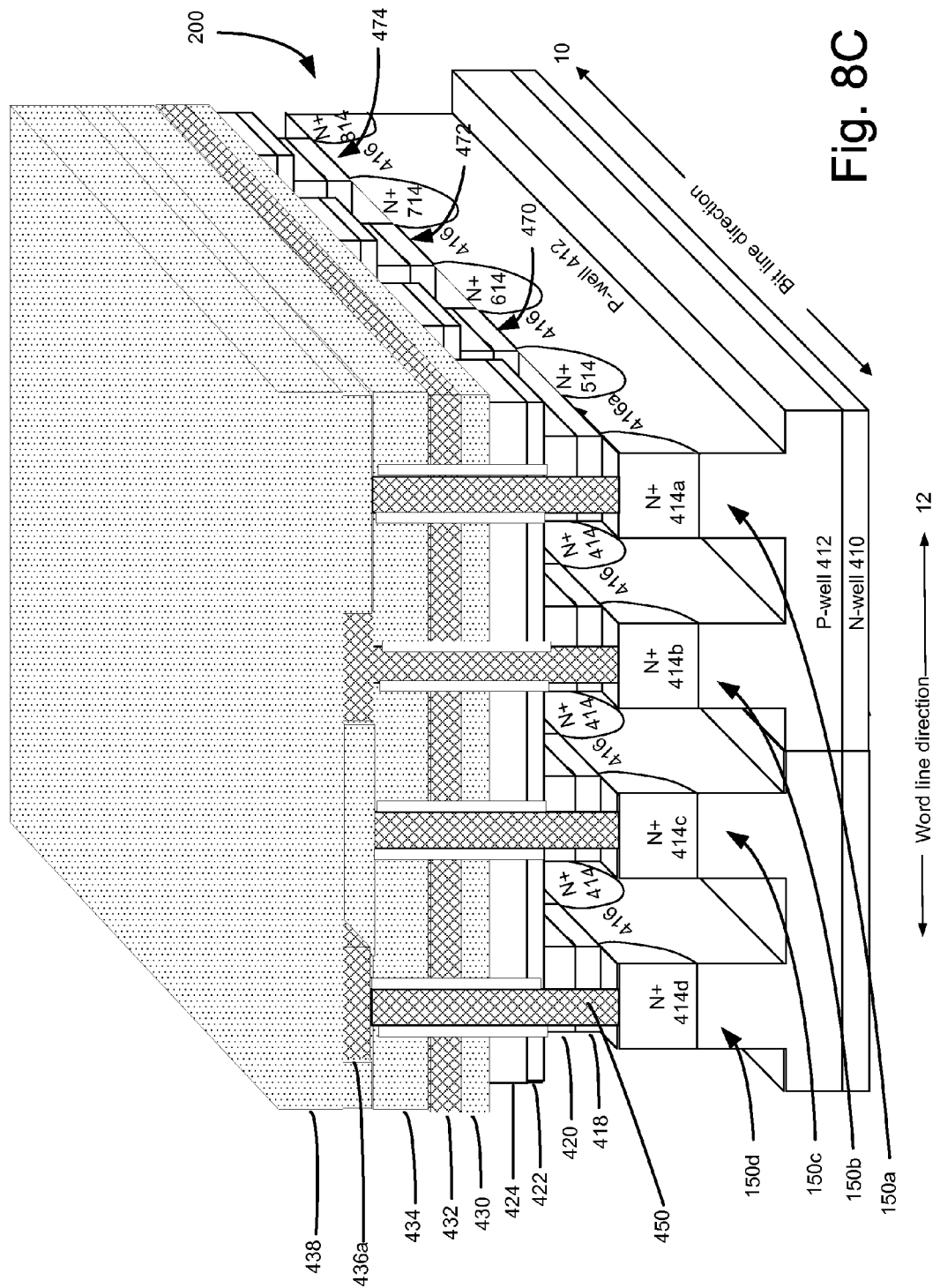

In FIG. 8C, a dielectric layer 438 is formed over the metal 1 layer 436 and extends over the entire array 200. Further, the dielectric layer 438 is formed so as to fill in the gaps between bit lines formed in the metal 1 layer.

Figure 8D:
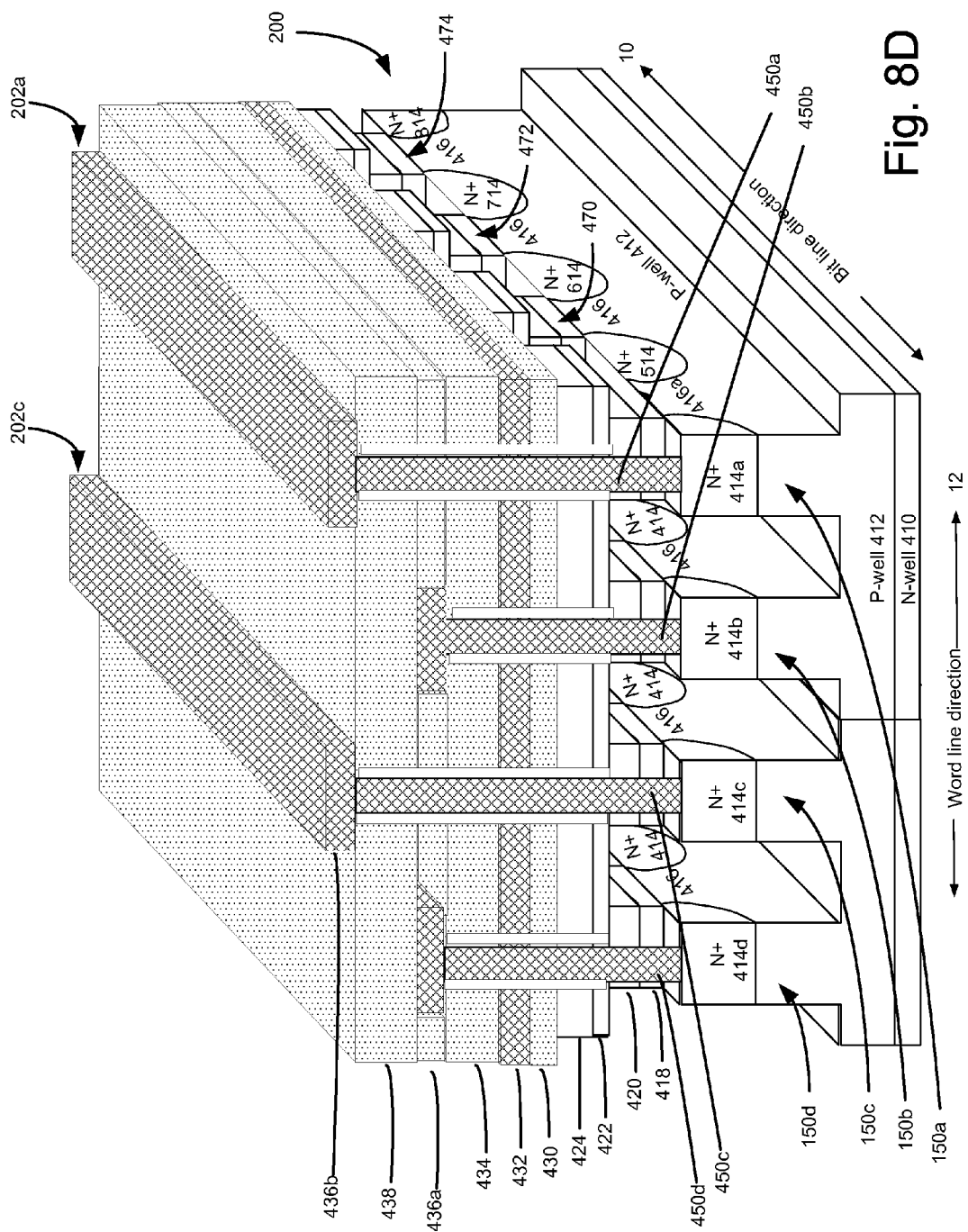
Figure 8E:
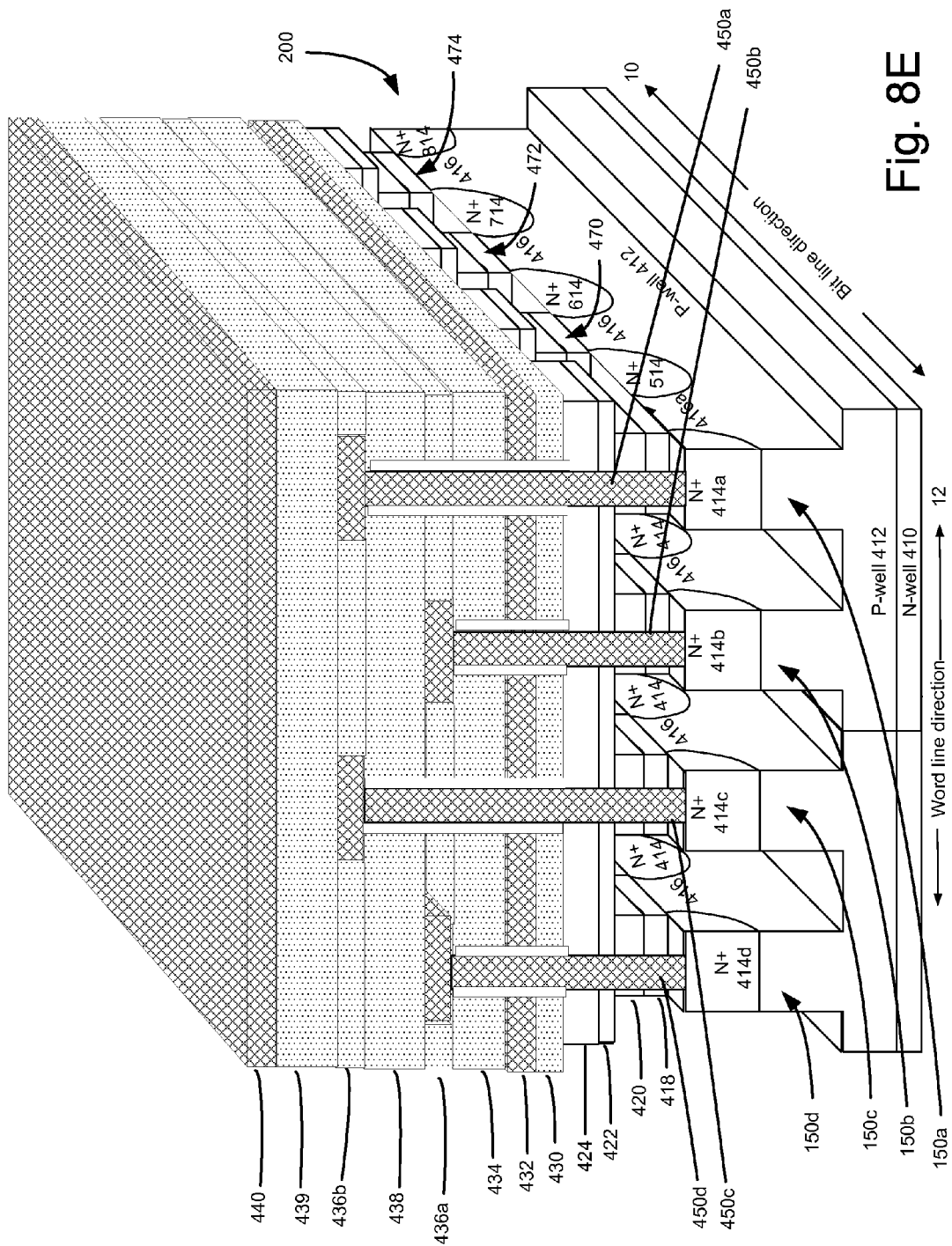

In FIG. 8D, a third metal layer 436b (metal 2) is formed over the dielectric layer 438 and patterned to create discrete, parallel metal structures corresponding with over every other column of the array 200. Thus, bit line 202a corresponds to NAND string 150a and bit line 202c corresponds to NAND string 150c. As in the metal 1 layer, the bit lines 202a and 202c are formed in the metal 2 layer at lower density, i.e., at a pitch of 4f. Further, vias 450a and 450c are formed up to the bit lines in the metal 2 layer, whereas vias 450b and 450d are formed up to the bit lines in the metal 1 layer. Finally, in FIG. 8E, a dielectric layer 439 and a fourth metal layer 440 (metal 3) are formed over the metal 2 layer 436b. The metal 3 layer 440 is typically coupled to a source voltage such as Vss and provides local interconnections (not shown).

Figure 9B:
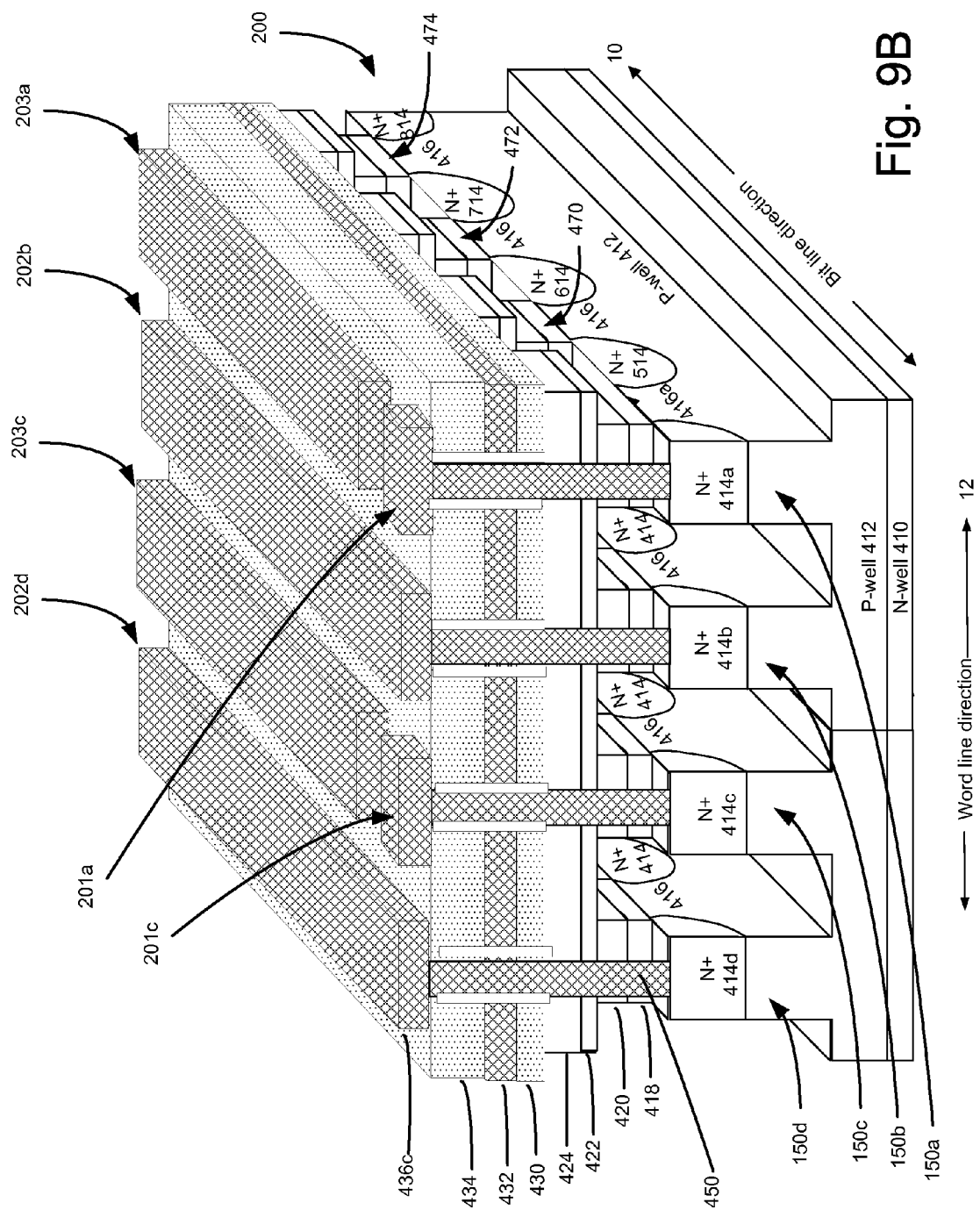

Referring now to FIGS. 9A-9E, a second embodiment of a bit line structure formed in different metal layers will be described. FIG. 9A is identical to FIG. 8A, and shows a three-dimensional cross-section of a portion of the array 200 from the dielectric layer 434 downward. Thus, four parallel NAND strings 150a, 150b, 150c, and 150d are illustrated, with a dielectric layer 430 and a first metal layer 432 (metal 0) formed over the control gate layer 424, and a dielectric layer 434 formed over the metal 0 layer 432 and extending over the entire array 200. As before, the vias 450 are formed by etching the dielectric layers to open a hole, then forming barrier layers within the vias, then forming metal plugs into the vias.

In FIG. 9B, the second metal layer 436c (metal 1) is formed over the dielectric layer 434, and patterned to create several discrete, parallel metal structures. However, in this embodiment, bit lines 202b and 202d are patterned in the metal 1 layer to correspond with every other column of array 200, e.g., NAND strings 150b and 150d, respectively, in this view. The bit lines 202b and 202d extend along the full length of every other column.

Contact blocks 201a and 201c are patterned in the metal 1 layer to provide a generally square contact area in correspondence with the drain regions 414a and 414c. Shield lines 203a and 203c are also patterned in the metal 1 layer to correspond with every other column of array 200, e.g., NAND strings 150a and 150c, respectively, although each of the shield lines 203a and 203c is formed in segments, rather than extending the full length, between contact blocks 201a and 201c along each column of the array. Dielectric material of the subsequent layer 438 fills in the gaps between the contact blocks and the shields. Thus, the metal lines in the metal 1 layer are effectively formed at a pitch of 2f, although only half the lines are bit lines, and the other half of the lines act as shields. The shields are provided to protect neighboring cells from cross communication between bit lines.

Figure 9C:
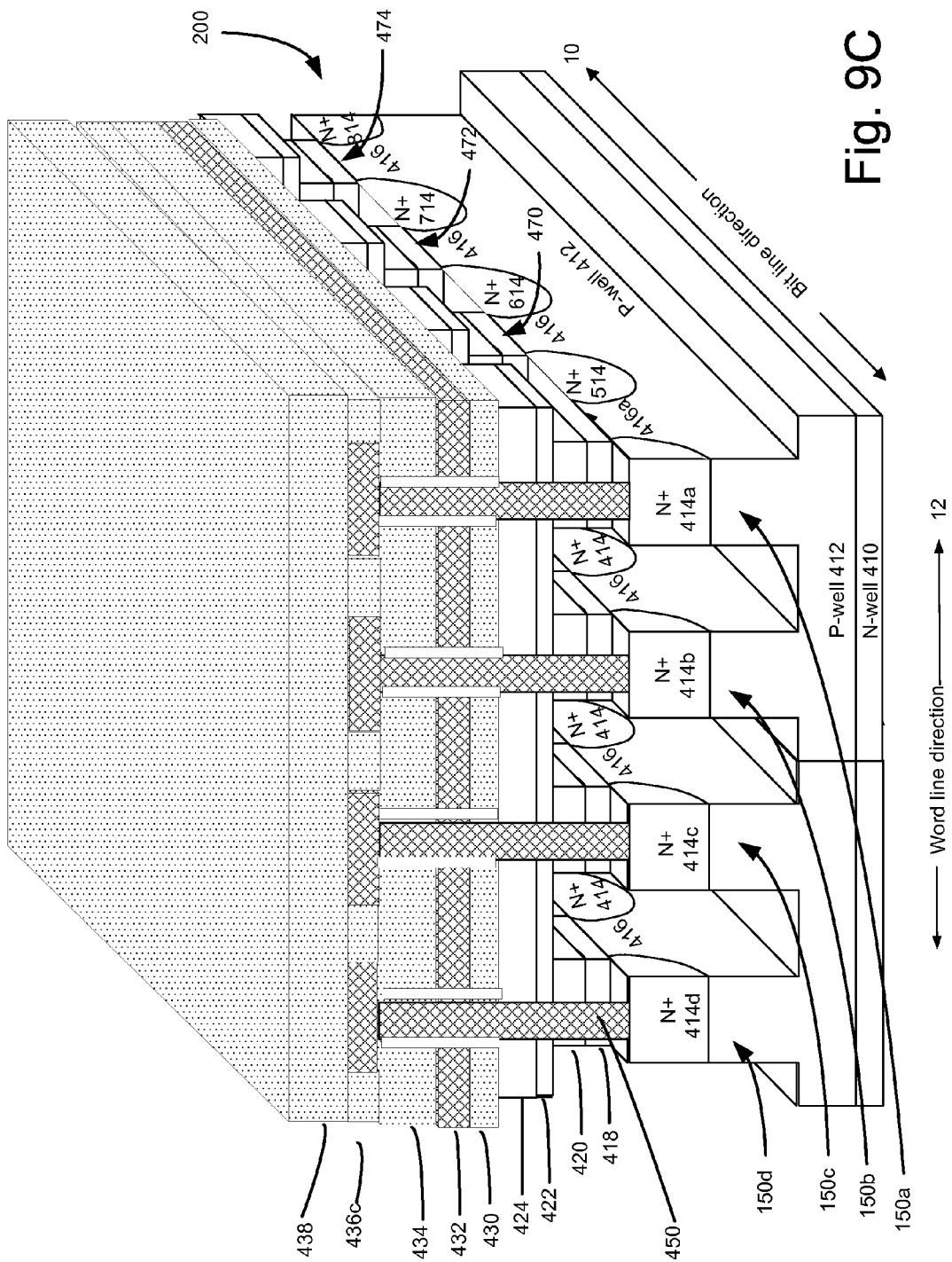

In FIG. 9C, a dielectric layer 438 is formed over the metal 1 layer 436 and extends over the entire array 200. Further, the dielectric layer 438 is formed so as to back fill in the gaps between bit lines and shields formed in the metal 1 layer.

In FIG. 9D, a third metal layer 436d (metal 2) is formed over the dielectric layer 438 and patterned to create discrete, parallel metal structures corresponding with over every other column of the array 200, e.g., NAND strings 150a and 150c, respectively. The bit lines 202a and 202c extend along the full length of every other column. Contact blocks 201b and 201d are patterned in the metal 2 layer to provide a generally square contact area in correspondence with the drain regions 414b and 414d. Shield lines 203b and 203d are also patterned in the metal 2 layer to correspond with every other column of array 200, e.g., NAND strings 150b and 150d, respectively, although each of the shield lines 203b and 203d, is formed in segments between contact blocks 201b and 201d along every other column of the array, rather than being formed along the full length of the array. Thus, the metal lines in the metal 2 layer are also effectively formed at a pitch of 2f, although only half the lines are bit lines, and the other half of the lines act as shields.

Figure 9E:
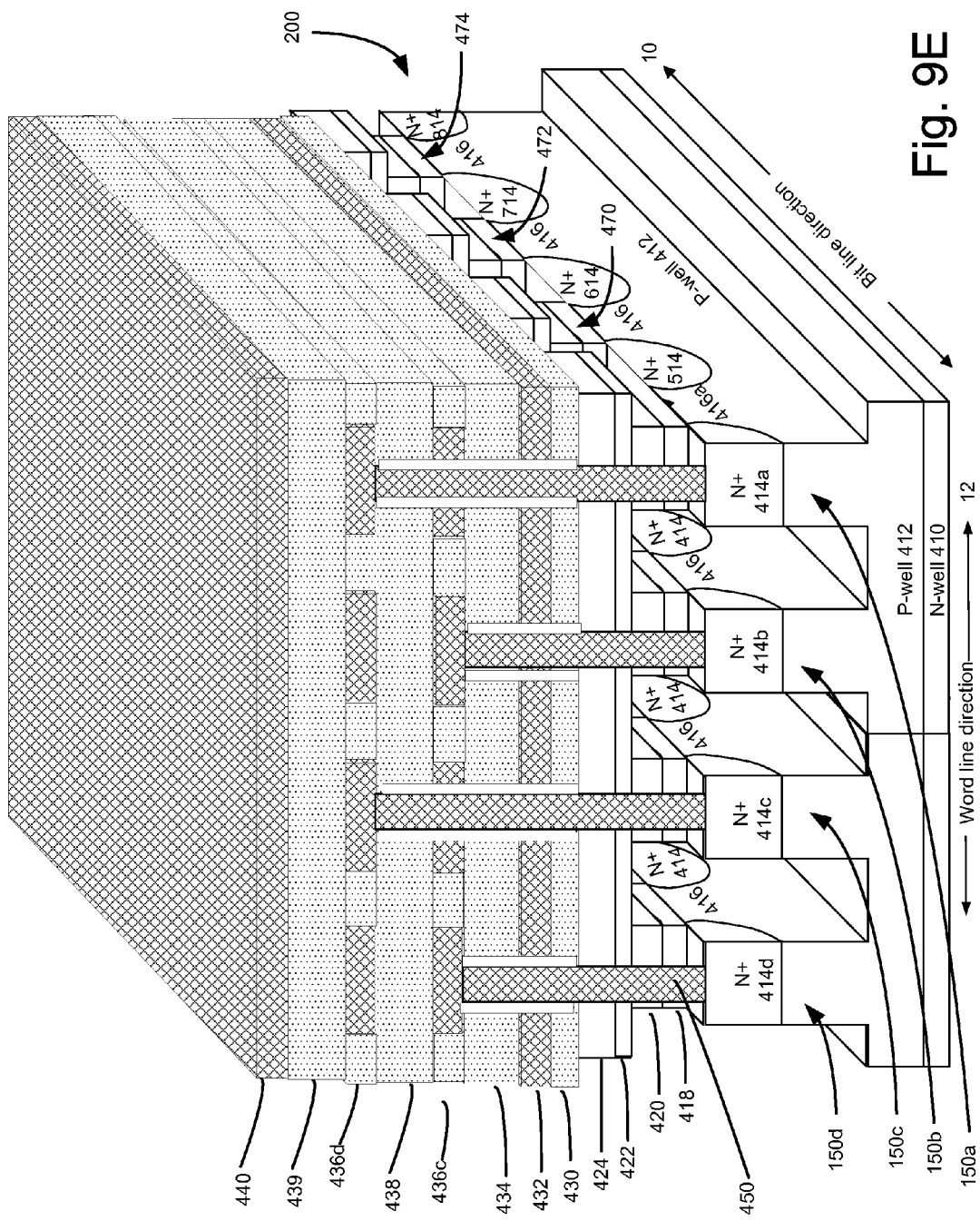

In FIG. 9E, a dielectric layer 439 and a fourth metal layer 440 (metal 3) are formed over the metal 2 layer 436d. The dielectric layer fills in the gaps in the metal 2 layer between the bit lines, the contact blocks, and the shields.

In preferred embodiments of FIGS. 8 and 9, the materials used are the same as in the conventional arrangement. Thus, the metal 0 layer is tungsten, the metal 1 and metal 2 layers are copper, and the metal 3 layer is aluminum. In one embodiment using a 56 nm architecture, the thickness of the metal 0 and metal 3 layers is approximately 100 nm, the thickness of bit lines and shields is approximately 80 nm, and the thickness of the insulating layers is approximately 250 nm. Further, the bit lines are formed to be approximately 60 nm wide, and the 4f pitch between bit lines translates to a lateral spacing of approximately 220 nm on center. Also, the lateral spacing between the bit lines formed in the metal 1 layer and the bit lines formed in the metal 2 layer is approximately 110 nm on center.

Using the arrangements shown in FIGS. 8 and 9, total capacitance and bit line to bit line capacitance is reduced significantly. Therefore, the precharge time will be reduced, and the total integration time can be reduced to about 400 nanoseconds, compared with an integration time of about 5 to 10 milliseconds for conventional structures. Further, the sensing current can also be reduced, perhaps as far as 50 nanoamps. Use of a lower sensing current will improve cell characteristics, such as transconductance, and will reduce the susceptibility to problems arising from transconductance degraded cells. The lower sensing current will also allow the use of lower bit line voltages, thus saving power, as well as making the natural distributions tighter. This leads to fewer programming pulses being needed, which also allows program verify step speed to be improved. All of this translates into significant gains in write and read performance. The improved write performance can be traded off for smaller program step sizes, which will result in tighter distributions of programmed states and bigger margins.

In the embodiment shown in FIGS. 8A-8E, the lines formed in the metal 1 layer could be considered even lines, and the lines formed in the metal 2 layer could be considered odd lines.

In the embodiment shown in FIGS. 9A-9E, the lines formed in the metal 1 layer could be considered even and odd lines, wherein the even lines are used for bit lines, and the odd lines are broken up into grounded shielding sections. Likewise, the lines formed in the metal 2 layer could also be considered even and odd lines, wherein the odd lines are used for bit lines, and the even lines are broken up into grounded shielding sections. The shields in the metal 1 layer are grounded to source lines, whereas the shields in the metal 2 layer are connected to the metal 3 layer.

Figure 10:
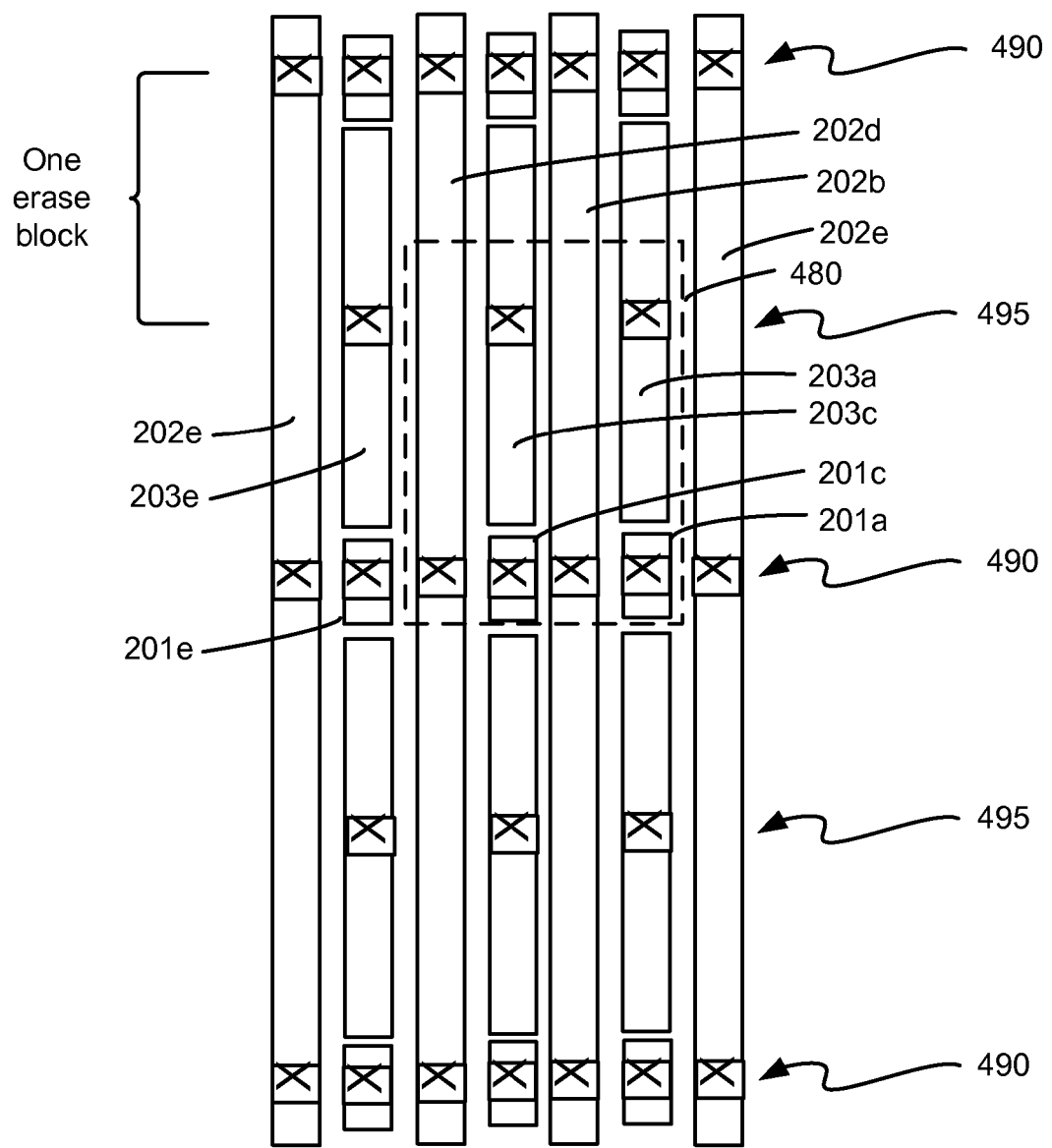
FIG. 10 is top plan view illustrating the alternative bit line arrangement of FIGS. 9A-9E.

FIG. 10 illustrates a top view of a portion of the metal 1 layer, for example, dotted area 480 corresponds to the layer 436c shown in FIG. 9B. Bit lines 202b, 202d, and 202e are formed to alternate with shields 203a, 203c, and 203e. The metal 2 layer 436d will be similarly arranged, but the positions of the bit lines on the metal 2 layer will correspond with the positions of the shields on the metal 1 layer, and the positions of the shields on the metal 2 layer will correspond with the positions of the bit lines on the metal 1 layer. Shields 203a, 203c, and 203e are preferably formed in segments between the contact blocks 490, and the contact blocks 490 are formed at regular intervals along the array, for example, one per every two blocks. The contact blocks 490 are formed to connect downward to a drain region 414 and to connect upward to corresponding contact blocks in the metal 2 layer. The shields 203a, 203c, and 203e each include source line contacts 495, which are spaced apart in between each of the contact blocks 490, and which are formed to connect downward to a source region 414. Similar source line contacts on the metal 2 layer could be formed to connect upward to the metal 3 layer, also known as the cell source mesh.

Figure 11:
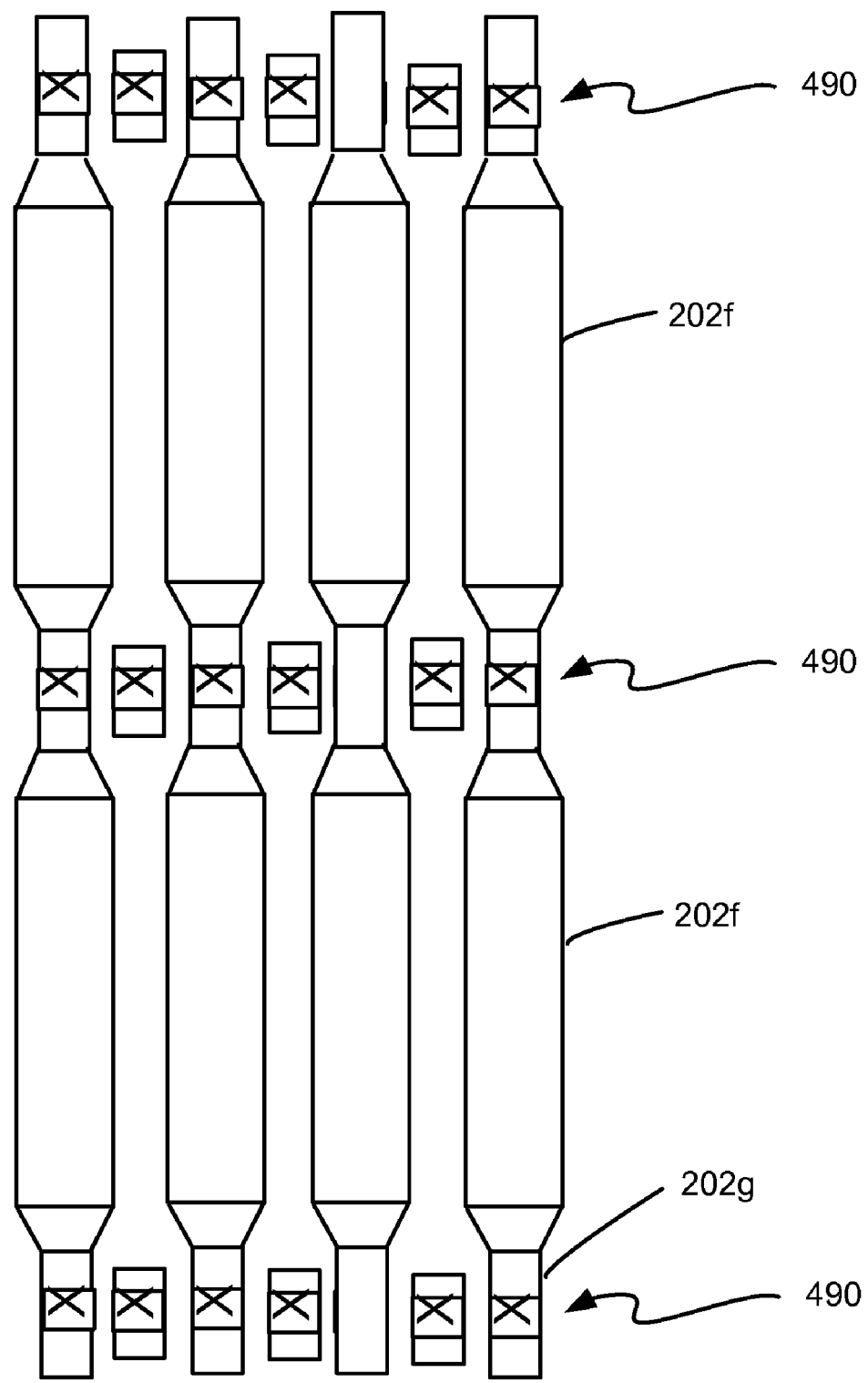
FIG. 11 is a top plan view illustrating an alternative bit line structure.

FIG. 11 illustrates an alternative bit line structure without shields. In this arrangement, the bit lines 202f are formed to be narrower proximate to the contact blocks 490, e.g., at regions 202g, and wider between the contact blocks, e.g., at regions 202f. For example, in a 56 nm embodiment, the narrower regions 202g may be approximately 60 nm, and the wider regions 202f may be approximately 120 nm. This arrangement will increase the capacitance but decrease the resistance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for connecting bit lines to non-volatile storage elements, said storage elements formed in an array on a semiconductor substrate, comprising:
    forming a plurality of corresponding parallel structures in at least two metal layers over the array, wherein every other parallel structure in each metal layer defines a bit line, and the remaining parallel structures in between the bit lines in each metal layer define shields to protect against cross-talk between the bit lines and contact blocks such that each of the shields is formed in segments between the contact blocks along each alternating column of the array and wherein the bit lines and shields are formed to alternate between the metal layers, and
    forming connections between the bit lines and the storage elements.

2. The method of claim 1, wherein the step of forming a plurality of parallel structures comprises:
    forming a first metal layer over the array to define a first set of bit lines formed in correspondence with a first set of storage elements and a first set of shields formed in correspondence with a second set of storage elements; and
    forming a second metal layer over the first metal layer to define a second set of bit lines formed in correspondence with the second set of storage elements and a second set of shields formed in correspondence with the first set of storage elements;
    wherein the first and second sets of storage elements are defined as alternating columns of the array.

3. The method of claim 1, wherein the bit lines are formed at a pitch of 4f in each of the metal layers.

4. The method of claim 1, further comprising:
    forming each of the shields in segments between the bit line connections.

5. The method of claim 1, further comprising:
    connecting each of the shields in a first of the metal layers to a ground potential, and connecting each of the shields in a second of the metal layers to a source potential.

6. The method of claim 1, wherein the contact blocks are patterned in each metal layer to provide contact areas in correspondence with drain regions of the array.

7. The method of claim 6, wherein the contact areas are generally square contact areas.

8. The method of claim 2, further comprising forming a first dielectric layer over the first metal layer, the first dielectric layer extending over the entire array.

9. The method of claim 8, wherein the first dielectric layer fills gaps between the bit lines, the shields and the contact blocks formed in the first metal layer.

10. The method of claim 8, further comprising forming a second dielectric layer and a third metal layer over the second metal layer.

11. The method of claim 10, wherein the second dielectric layer fills gaps between the bit lines, the shields and the contact blocks formed in the second metal layer.

12. The method of claim 2, wherein the first metal layer and the second metal layer are copper.

* * * * *